(12) United States Patent
Sung et al.

(10) Patent No.: US 11,871,599 B2
(45) Date of Patent: Jan. 9, 2024

(54) DISPLAY DEVICE

(71) Applicant: Samsung Display Co., Ltd., Yongin-si (KR)

(72) Inventors: Tae Hyun Sung, Uiwang-si (KR); Sang Yeol Kim, Hwaseong-si (KR); Woo Sik Jeon, Hwaseong-si (KR); Jung Min Choi, Hwaseong-si (KR); Eon Seok Oh, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 93 days.

(21) Appl. No.: 17/214,895

(22) Filed: Mar. 28, 2021

(65) Prior Publication Data

US 2022/0131103 A1 Apr. 28, 2022

(30) Foreign Application Priority Data

Oct. 28, 2020 (KR) ........................ 10-2020-0141330

(51) Int. Cl.
*H10K 50/82* (2023.01)
*H10K 50/844* (2023.01)
*H10K 59/122* (2023.01)
*H10K 59/124* (2023.01)
*H10K 71/00* (2023.01)

(52) U.S. Cl.
CPC ........... *H10K 50/82* (2023.02); *H10K 50/844* (2023.02); *H10K 59/122* (2023.02); *H10K 59/124* (2023.02); *H10K 71/00* (2023.02)

(58) Field of Classification Search
CPC . H01L 51/56; H01L 51/5253; H01L 51/5221; H01L 27/3234; H01L 27/3258; H01L 37/3246; H10K 59/124; H10K 59/65; H10K 59/122; H10K 50/844; H10K 50/82; H10K 71/00
See application file for complete search history.

(56) References Cited

U.S. PATENT DOCUMENTS

| | | | |
|---|---|---|---|
| 10,135,010 B2 | 11/2018 | Kim et al. | |
| 10,840,317 B2 | 11/2020 | Oh et al. | |
| 2017/0148856 A1* | 5/2017 | Choi | ................... H01L 27/3258 |
| 2017/0345881 A1* | 11/2017 | Kim | ..................... H10K 59/123 |

(Continued)

FOREIGN PATENT DOCUMENTS

| | | |
|---|---|---|
| CN | 109300957 | 2/2019 |
| CN | 110649180 | 1/2020 |

(Continued)

*Primary Examiner* — Vongsavanh Sengdara
(74) *Attorney, Agent, or Firm* — H.C. Park & Associates, PLC

(57) ABSTRACT

A display device includes: a substrate including an opening area, a peripheral area surrounding the opening area, and a display area surrounding the peripheral area; a transistor overlapping the display area and disposed on the substrate; a first electrode electrically connected to the transistor; an intermediate layer and a second electrode disposed on the first electrode and extending to the peripheral area; and a metal layer overlapping the intermediate layer and the second electrode in the peripheral area, wherein an end of the first metal layer and an end of the second electrode are aligned, and an end of the intermediate layer is protruded more than the end of the first metal layer.

20 Claims, 24 Drawing Sheets

(56) References Cited

U.S. PATENT DOCUMENTS

| | | | | |
|---|---|---|---|---|
| 2018/0102502 A1* | 4/2018 | Kim | ........................ | H01L 22/12 |
| 2018/0286938 A1* | 10/2018 | Moon | .................. | H10K 77/111 |
| 2018/0301651 A1* | 10/2018 | Kamiya | .............. | H10K 50/171 |
| 2019/0229175 A1* | 7/2019 | Lhee | ...................... | H10K 59/88 |
| 2020/0105844 A1 | 4/2020 | Wang et al. | | |
| 2020/0136087 A1* | 4/2020 | Kim | ........................ | H10K 71/00 |
| 2020/0144341 A1* | 5/2020 | Choi | .................... | H10K 59/122 |
| 2020/0287157 A1* | 9/2020 | Seong | .................. | H10K 59/12 |
| 2020/0295310 A1* | 9/2020 | Moon | .................. | H10K 50/865 |

FOREIGN PATENT DOCUMENTS

| | | |
|---|---|---|
| KR | 10-2016-0057197 | 5/2016 |
| KR | 10-2017-0045459 | 4/2017 |
| KR | 10-2020-0102580 | 9/2020 |

\* cited by examiner

DISPLAY DEVICE

CROSS-REFERENCE TO RELATED APPLICATION

This application claims priority to and the benefit of Korean Patent Application No. 10-2020-0141330, filed on Oct. 28, 2020, which is hereby incorporated by reference for all purposes as if fully set forth herein.

BACKGROUND

Field

Embodiments of the invention relate generally to a display device.

Discussion of the Background

Recently, as various portable types of electronic devices have included a camera function, a case in which only one electronic device in which the camera function is built in is carried has increased at a rapid rate compared to a case in which a camera is not a function of the electronic device and thus a separate camera has to be carried by a user in order to take pictures.

In the conventional art, because the camera, a flash, a speaker, a photosensor, and the like are provided outside of an image display area of the electronic device, there is a tendency for a space where the electronic device displays an image to be decreased in order to accommodate the camera in a non-image-display area of the electronic device.

The above information disclosed in this Background section is only for understanding of the background of the inventive concepts, and, therefore, it may contain information that does not constitute prior art.

SUMMARY

Devices constructed according to illustrative implementations of the invention are capable of improving the reliability of an electronic device that has a display function by the inclusion of a metal layer having an end aligned with an end of an electrode in a peripheral area that surrounds a display area of the electronic device, to thereby lessen the chances of cracks forming in the peripheral area that may negatively affect the operational effectiveness (i.e., display capability) of the electronic device.

An embodiment provides a display device with improved device reliability in a peripheral area surrounding an opening area within a display area of the display device.

Additional features of the inventive concepts will be set forth in the description which follows, and in part will be apparent from the description, or may be learned by practice of the inventive concepts.

A display device according to an embodiment includes: a substrate including an opening area, a peripheral area surrounding the opening area, and a display area surrounding the peripheral area; a transistor overlapping the display area and disposed on the substrate; a first electrode electrically connected to the transistor; an intermediate layer and a second electrode disposed on the first electrode and extending to the peripheral area; and a first metal layer overlapping the intermediate layer and the second electrode in the peripheral area, wherein an end of the first metal layer and an end of the second electrode are aligned, and an end of the intermediate layer is protruded more than the end of the first metal layer.

The intermediate layer may cover the end of the first metal layer.

The display device may further include an encapsulation layer disposed on the second electrode, and the encapsulation layer may include: a first encapsulation inorganic layer disposed on the second electrode; an encapsulation organic layer disposed on the first encapsulation inorganic layer; and a second encapsulation inorganic layer disposed on the encapsulation organic layer.

The end of the second electrode may overlap the encapsulation organic layer.

The display device may further include at least two or more dams disposed in the peripheral area.

The dam may include a first dam and a second dam separated from each other, and the display device may include: a first-first layer overlapping the first dam; and a first-second layer overlapping the second dam.

The display device may further include a first-third layer disposed between the second dam and the opening area.

The display device may further include a second-first layer disposed between the second dam and the opening area.

The display device may further include a second metal layer overlapping at least one of the first dam and the second dam.

The second metal layer may overlap at least one of the first-first layer and the first-second layer, and the display device may further include a second-second layer overlapping the second metal layer and disposed on the same layer as the second electrode.

The display device may include: an inorganic insulating layer disposed on the substrate; an organic insulating layer disposed on the inorganic insulating layer; and a pixel definition layer and a spacer disposed on the organic insulating layer.

The first metal layer may be disposed between the inorganic insulating layer and the organic insulating layer.

The display device may include a plurality of organic insulating layers, and the first metal layer may be positioned between two adjacent organic insulating layers among a plurality of organic insulating layers.

The first metal layer may be disposed between the organic insulating layer and the pixel definition layer.

The first metal layer may be disposed between the pixel definition layer and the spacer.

A display device according to an embodiment includes: a substrate including an opening area, a peripheral area surrounding the opening area, and a display area surrounding the peripheral area; a transistor overlapping the display area and disposed on the substrate; a first electrode electrically connected to the transistor; an intermediate layer and a second electrode disposed on the first electrode and extending into the peripheral area; a first metal layer overlapping the intermediate layer and the second electrode in the peripheral area; and an encapsulation layer disposed on the second electrode and including an encapsulation organic layer, wherein an end of the first metal layer and an end of the second electrode are aligned, an end of the intermediate layer covers the end of the first metal layer, and the end of the first metal layer overlaps the encapsulation organic layer.

The end of the second electrode may have a flat shape.

The first metal layer may include silver (Ag) or aluminum (Al).

The display device may include: a dam disposed in the peripheral area; and a first-first layer overlapping the dam, and the distance between the end of the first metal layer and the end of the first-first layer adjacent to the first metal layer may be about 35 micrometers or more.

The end of the intermediate layer extending to the peripheral area and the end of the first-first layer may be separated.

The intermediate layer may include a functional layer, and the functional layer may include at least one among a hole injection layer, a hole transporting layer, an electron transporting layer, and an electron injection layer.

The first-first layer may include the same material as at least one among the hole injection layer, the hole transporting layer, the electron transporting layer, and the electron injection layer.

According to an embodiment, reliability of a stacked structure in the peripheral area adjacent to the opening area may be improved by easily controlling the shape of the end of the second electrode. By forming the flat end of the electrode, it may prevent the occurrence of cracks in the inorganic layer and the penetration of foreign particles.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION OF THE EMBODIMENTS

Figure 1:
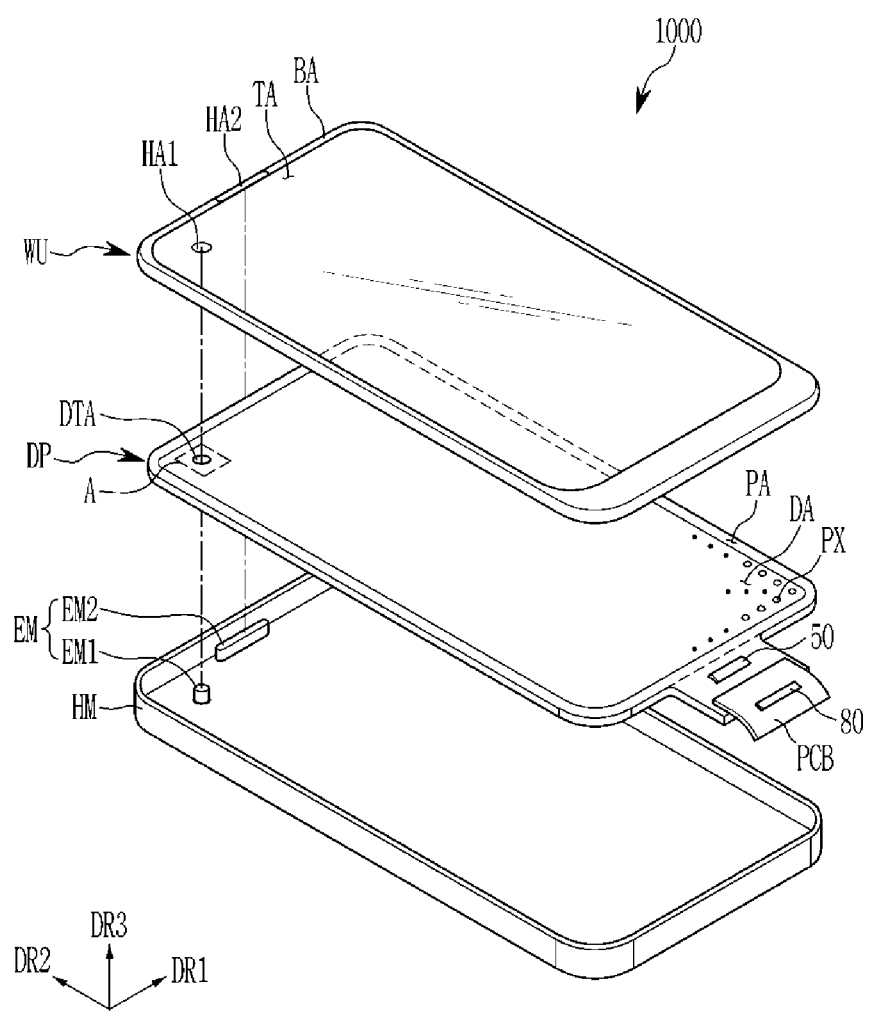
FIG. 1 is an exploded perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "haves," "having," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Further, throughout the specification, the phrase "on a plane" denotes viewing a target portion from the top, and the phrase "on a cross-section" denotes viewing a cross-section formed by vertically cutting a target portion from the side.

Hereinafter, a display device according to an embodiment is schematically described with reference to FIG. 1 to FIG. 3. FIG. 1 is an exploded perspective view of a display device according to an embodiment, FIG. 2 is a schematic cross-sectional view of a display device according to an embodiment, and FIG. 3 is a top plan view of some constituent elements of a display panel according to an embodiment.

Figure 2:
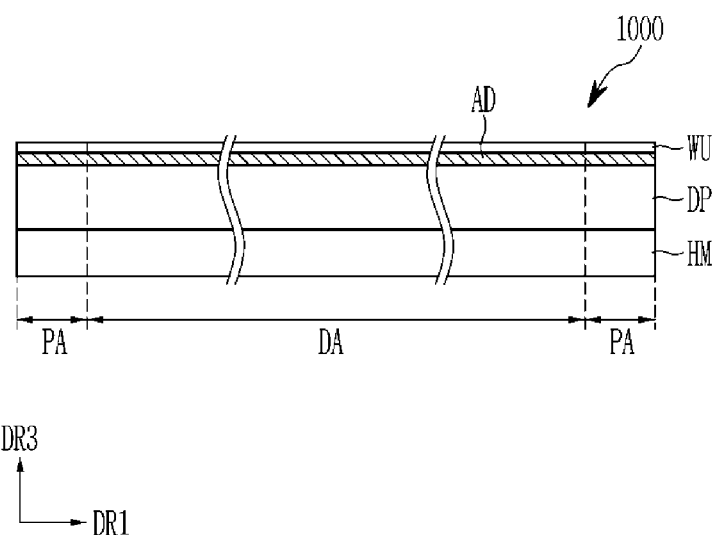
FIG. 2 is a schematic cross-sectional view of a display device according to an embodiment.
Figure 3:
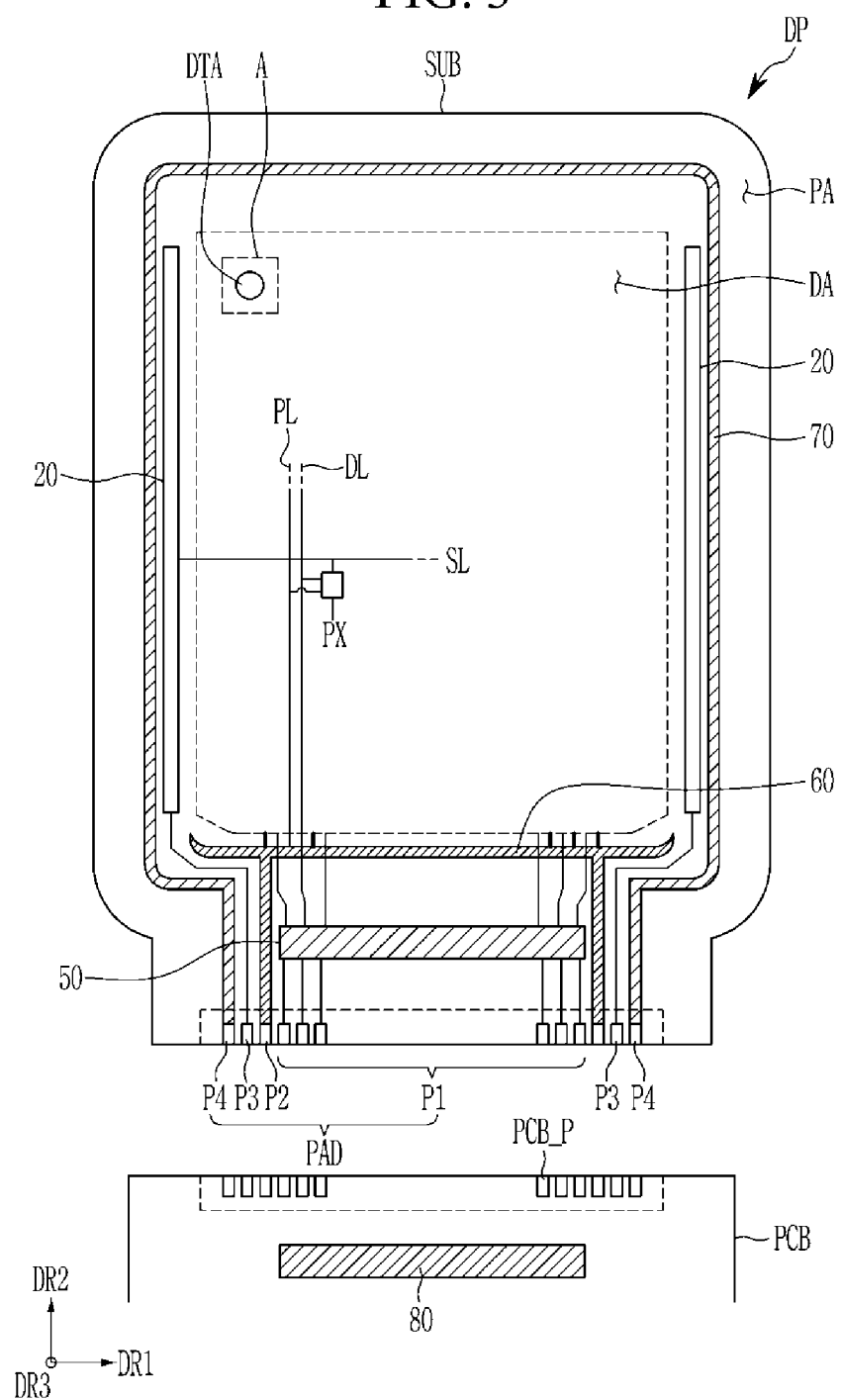
FIG. 3 is a top plan view of some constituent elements of a display panel according to an embodiment.

First, referring to FIG. 1 and FIG. 2, a display device 1000 displays an image toward a third direction DR3 on a plane defined by a first direction DR1 and a second direction DR2 (in which the first direction DR1 is orthogonal to the second direction DR2), and in which the third direction DR3 is orthogonal to both the first direction DR1 and the second direction DR2, to thereby form an {x-y-z} three-dimensional coordinate system). The front (or a top) and the back (or a bottom) of each member are distinguished by the third direction DR3. The directions indicated by the first to third directions DR1, DR2, and DR3 are relative concepts and may be converted into other directions.

The display device 1000 includes a cover window WU, a display panel DP, and a housing member HM. In the embodiment, the cover window WU, the display panel DP, and the housing member HM are combined to constitute the display device 1000.

The cover window WU is disposed on the display panel DP to protect the display panel DP. The cover window WU may include a transmittance area TA and a blocking area BA. The transmittance area TA is an optically transparent area and may be an area that transmits incident light. The blocking area BA may be an area having relatively low light transmittance compared to the transmittance area TA. The blocking area BA defines a shape of the transmittance area TA. The blocking area BA may surround the transmittance area TA. The blocking area BA may represent a predetermined color. The blocking area BA overlaps the non-display area PA of the display panel DP to block the non-display area PA from being recognized from the outside.

The cover window WU may include a first hole area HA1 and a second hole area HA2. Each of the first hole area HA1 and the second hole area HA2 may overlap an electronic module EM described later. The electronic module EM may be operated by receiving external signals provided through the first hole area HA1 and the second hole area HA2.

According to an embodiment, the first hole area HA1 may be positioned in the transmittance area TA, and the second hole area HA2 may be positioned in the blocking area BA. However, this is only illustrative, and the first hole area HA1 and the second hole area HA2 may be positioned in opposite areas, both in the transmittance area TA, or both in the blocking area BA.

In each of the first hole area HA1 and the second hole area HA2, a predetermined depressed part recessed from the rear surface of the cover window WU can be defined. The depressed part may include a groove part or an opening area having a greater depth than the thickness of the cover window WU.

The first hole area HA1 and the second hole area HA2 may have different shapes. The first hole area HA1 may have a circular shape on a plane, and the second hole area HA2 may have an elliptical shape having a long axis extending along the first direction DR1 on a plane. However, the shapes of the first hole area HA1 and the second hole area HA2 are not limited thereto, and the sizes and shapes may be variously modified.

The display panel DP may be a flat rigid display panel, but is not limited thereto, and may be a flexible display panel. The display panel according to an embodiment may be a light-emissive display panel, and is not particularly limited thereto. For example, the display panel may be an organic light emitting panel or a quantum dot emitting display panel.

The intermediate layer of the organic light emitting panel may include an organic light emitting material. The intermediate layer of the quantum dot light emitting display panel may include a quantum dot and a quantum rod. Hereinafter, the display panel is described as an organic light emitting panel.

The display panel DP displays an image on the front. The front of the display panel DP includes a display area (DA) and a non-display area PA. The image is displayed in the display area DA. The non-display area PA may surround the display area DA.

The display panel DP may include a plurality of pixels PX positioned in the display area DA. The pixels PX may display light in response to an electrical signal. The light displayed by the pixels PX may realize an image. The number of transistors and capacitors included in one pixel PX and the connection relationship may be varied in different ways.

The display panel DP according to an embodiment may include an opening area DTA penetrating the display panel DP. The opening area DTA may be positioned on the display area DA. The area A where the opening area DTA is positioned is described later. The opening area DTA may overlap the first hole area HA1 of the cover window WU. Some of a plurality of pixels PX may be disposed surrounding the opening area DTA. Therefore, the image may also be displayed in the area adjacent to the opening area DTA.

The display panel DP includes the non-display area PA extended from the display area DA and including a plurality of signal lines and a pad part. A data driver 50 may be positioned in the non-display area PA. According to an embodiment, the pad part of the non-display area PA may be electrically connected to a printed circuit board (PCB) including a driving chip 80, and is described in more detail in FIG. 3.

As shown in FIG. 2, an adhesive layer AD that attaches the display panel DP and the cover window WU may be positioned between the display panel DP and the cover window WU. Also, a touch unit positioned between the display panel DP and the cover window WU may be further included. The touch unit may be disposed on the display panel DP for the touchscreen function of the display device 1000. The touch unit may include a touch electrode of various patterns, and may be a resistive film type or a capacitance type.

The electronic module EM includes various functional modules to operate the display device 1000. The electronic module EM may be electrically connected to the display panel DP through a connector. For example, the electronic module EM may be a camera, a speaker, or a sensor for detecting light or heat.

The electronic module EM may include a first electronic module EM1 and a second electronic module EM2. The first electronic module EM1 may detect an external object received through the opening area DTA and the first hole area HA1. The first electronic module EM1 may receive external inputs transmitted through the opening area DTA and the first hole area HA1 or provide outputs through the opening area DTA and the first hole area HA1.

For example, the first electronic module EM1 may be at least any one of a light emitting module, a light sensing module, and a photographing module. For example, the first electronic module EM1 may include at least one of a light emitting module that outputs infrared light, a CMOS sensor for infrared detection, and a camera module that photographs an external subject.

The second electronic module EM2 may collect sound signals such as voice through the second hole area HA2 or provide sound signals such as processed voice to the outside. For example, the second electronic module EM2 may include at least one of an acoustic input module and an acoustic output module. The acoustic input module may include a microphone capable of receiving an acoustic signal. The sound output module may include a speaker that outputs sound data as a sound signal.

However, this is illustrated by way of example, and the electronic module EM may consist of a single module, may further include a greater number of the electronic modules, may be arranged in various arrangement relationships, and is limited to any one embodiment.

The housing member HM is disposed under the display panel DP. The housing member HM is combined with the cover window WU to form the exterior of the display device 1000. The housing member HM may contain a material having relatively high rigidity. For example, the housing member HM may include a plurality of frames and/or plates made of glass, plastic, and metal.

The housing member HM provides a predetermined accommodation space. The display panel DP may be accommodated in the accommodation space to be protected from external impact.

Next, referring to FIG. 3, the display panel DP includes a substrate SUB including the display area DA and the non-display area PA. The non-display area PA may be defined along the border of the display area DA.

The display panel DP includes a plurality of pixels PX. A plurality of pixels PX may be disposed in the display area DA on the substrate SUB. Each pixel PX includes a light-emitting element and a driving circuit part connected thereto. Each pixel PX emits light of, for example, red, green, and blue or white, and may include an organic light emitting element (an organic light emitting diode) as an example.

The display panel DP may include a plurality of signal lines and a pad part. The plurality of signal lines may include a scan line SL extending in the first direction DR1, and a data line DL and a driving voltage line PL extending in the second direction DR2.

The scan driver 20 generates and transmits a scan signal to each pixel PX through the scan line SL. According to an embodiment, the scan driver 20 may be disposed on the left and right sides of the display area DA. This specification shows a structure in which the scan driver 20 is disposed on both sides of the substrate SUB, but in another embodiment, the scan driver may be disposed only on one side of the substrate SUB.

The pad part PAD is disposed on one end of the display panel DP and includes a plurality of terminals P1, P2, P3, and P4. The pad part PAD is exposed without being covered by an insulating layer, and may be electrically connected to the printed circuit board (PCB). The pad part PAD may be electrically connected to the pad part PCB_P of the printed circuit board (PCB). The printed circuit board (PCB) may transmit a signal or power of the IC driving chip 80 to the pad part PAD.

The controller converts a plurality of image signals transmitted from the outside into a plurality of image data signals and transmits the converted signals to the data driver 50 through the terminal P1. In addition, the controller may receive a vertical synchronization signal, a horizontal synchronizing signal, and a clock signal, generates a control signal for controlling the driving of the scan driver 20 and the data driver 50, and transmits the control signal to each through the terminals P3 and P1. The controller transmits a driving voltage ELVDD to driving voltage supply wiring 60 through the terminal P2. In addition, the controller transmits a common voltage ELVSS to each common voltage supply wiring 70 through the terminal P4.

The data driver 50 is disposed on the non-display area PA, and generates and transmits a data signal to each pixel PX. The data driver 50 may be disposed on one side of the display panel DP, and may be disposed between the pad part PAD and the display area DA for example.

The driving voltage supply wiring 60 is disposed on the non-display area PA. For example, the driving voltage supply wiring 60 may be disposed between the data driver 50 and the display area DA. The driving voltage supply wiring 60 provides the driving voltage ELVDD to the pixels PX. The driving voltage supply wiring 60 may be disposed in the first direction DR1, and may be connected to a plurality of driving voltage lines PL disposed of in the second direction DR2.

The common voltage supply wiring 70 is disposed on the non-display area PA. The common voltage supply wiring 70 may have a shape surrounding the substrate SUB. The common voltage supply wiring 70 transmits the common voltage ELVSS to one electrode (e.g., a second electrode) of the light-emitting element included in the pixel PX.

Figure 4:
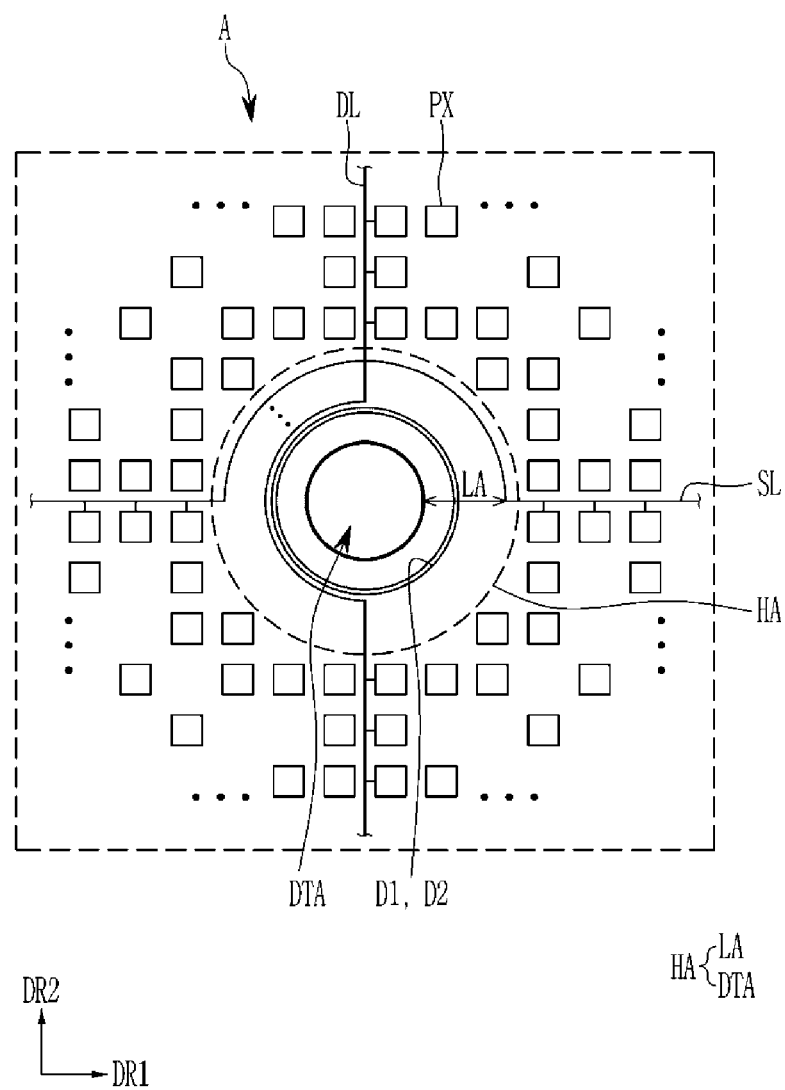
FIG. 4 is an enlarged top plan view of an area A of FIG. 1 and FIG. 3.

In the following, the area A including the opening area DTA shown in FIG. 3 is described with reference to FIG. 4. FIG. 4 is an enlarged top plan view of an area A of FIG. 1 and FIG. 3.

Referring to FIG. 4 with the above-described drawings, the display panel DP includes a plurality of signal lines SL and DL and a plurality of pixels PX, which are disposed on the substrate. Each of a plurality of pixels PX may be connected to a plurality of signal lines SL and DL. FIG. 4 describes the scan line SL and the data line DL among a plurality of signal lines as an example. However, this is illustrated as an example, and each pixel PX according to embodiments described herein may be additionally connected to various signal lines and is not limited to any one embodiment.

The hole area HA included in the display panel DP includes an opening area DTA and a peripheral area LA surrounding the opening area DTA.

The peripheral area LA is an area surrounding the periphery of the opening area DTA. The peripheral area LA may avoid damaging the wirings when irradiating a laser to form the opening area DTA. The peripheral area LA needs to keep at a minimum constant width. Also, the peripheral area LA includes dams D1 and D2.

The scan line SL and the data line DL have a semicircular structure, overlap the peripheral area LA, and may bypass the opening area DTA. A plurality of scan lines SL extends in the horizontal direction along the periphery of the opening area DTA. Here, a plurality of scan lines SL may include a scan line, a light emission control line, an initialization voltage line, or the like according to a signal. A plurality of data lines DL extend in the vertical direction along the periphery of the opening area DTA. A plurality of data lines DL may be composed of a driving voltage line and a driving low voltage line according to a signal. According to an embodiment, a plurality of scan lines SL and a plurality of data lines DL may be changed.

Figure 5A:
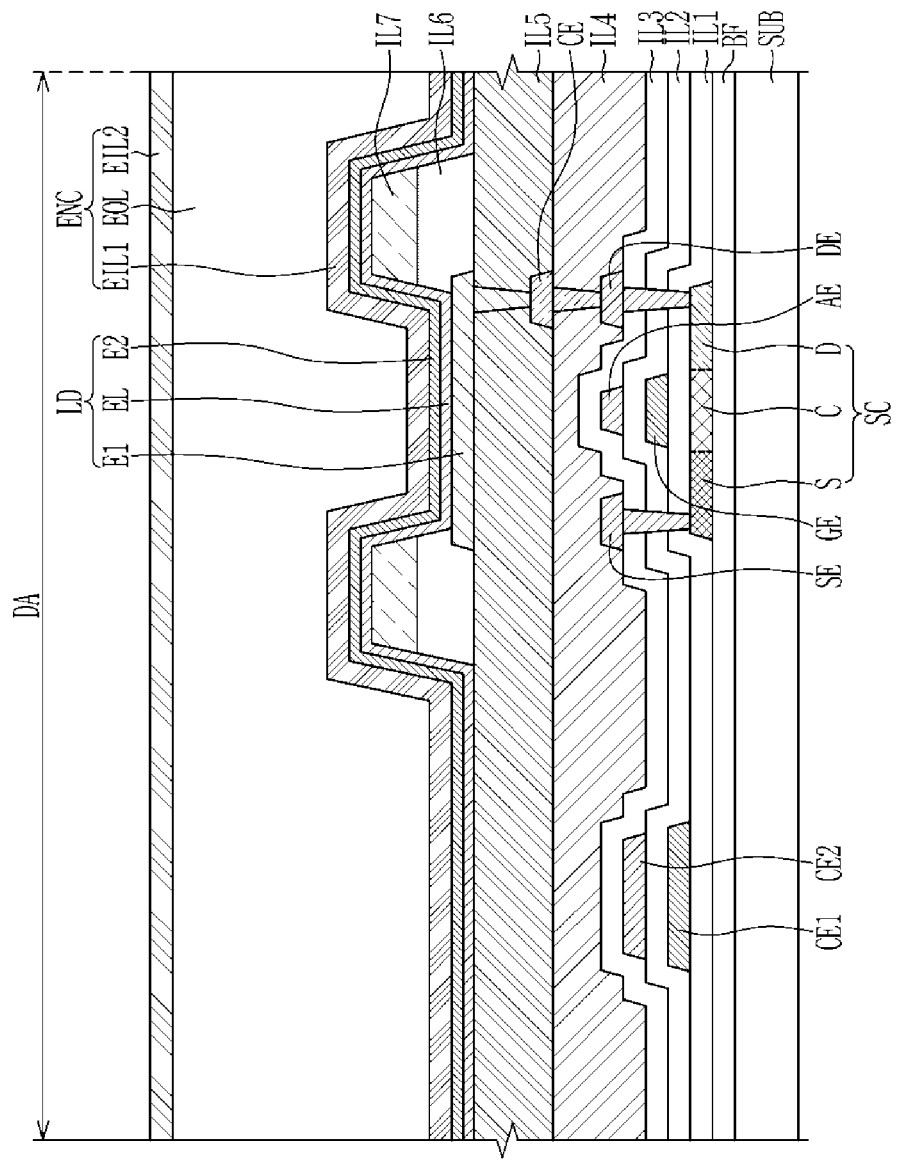
FIG. 5A is a cross-sectional view of a display panel corresponding to a display area.
Figure 5B:
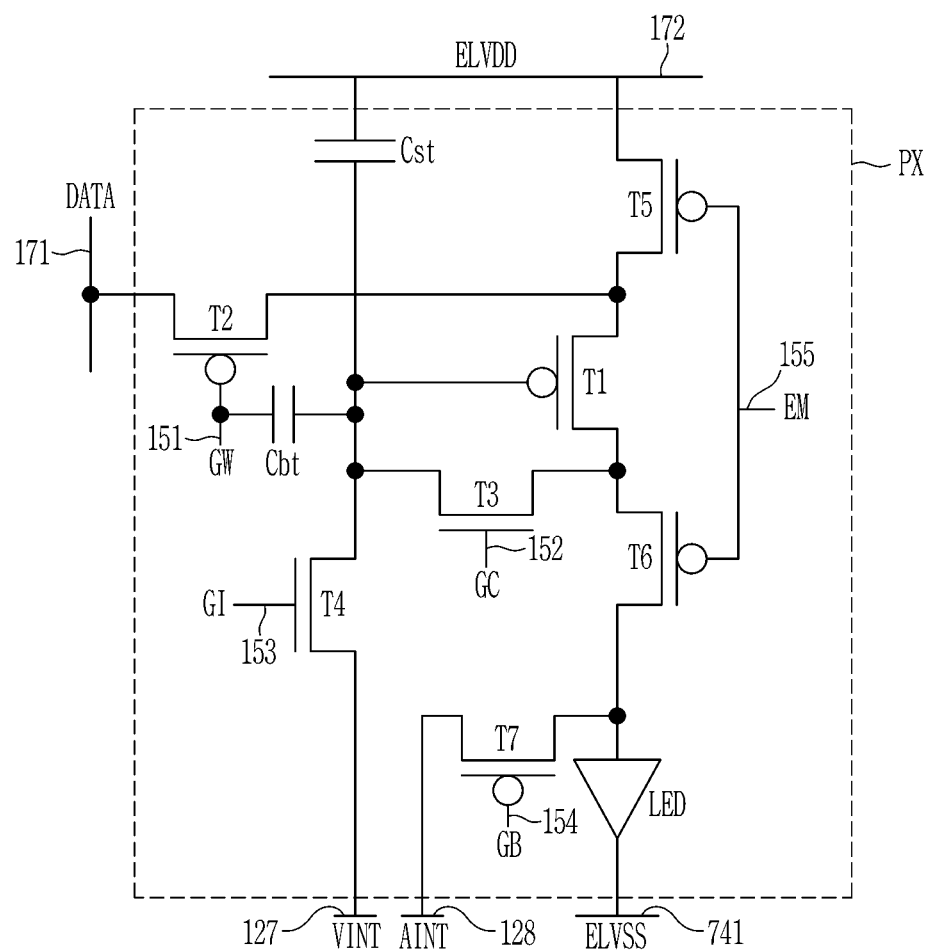
FIG. 5B is a circuit diagram of a display device according to an embodiment.
Figure 5C:
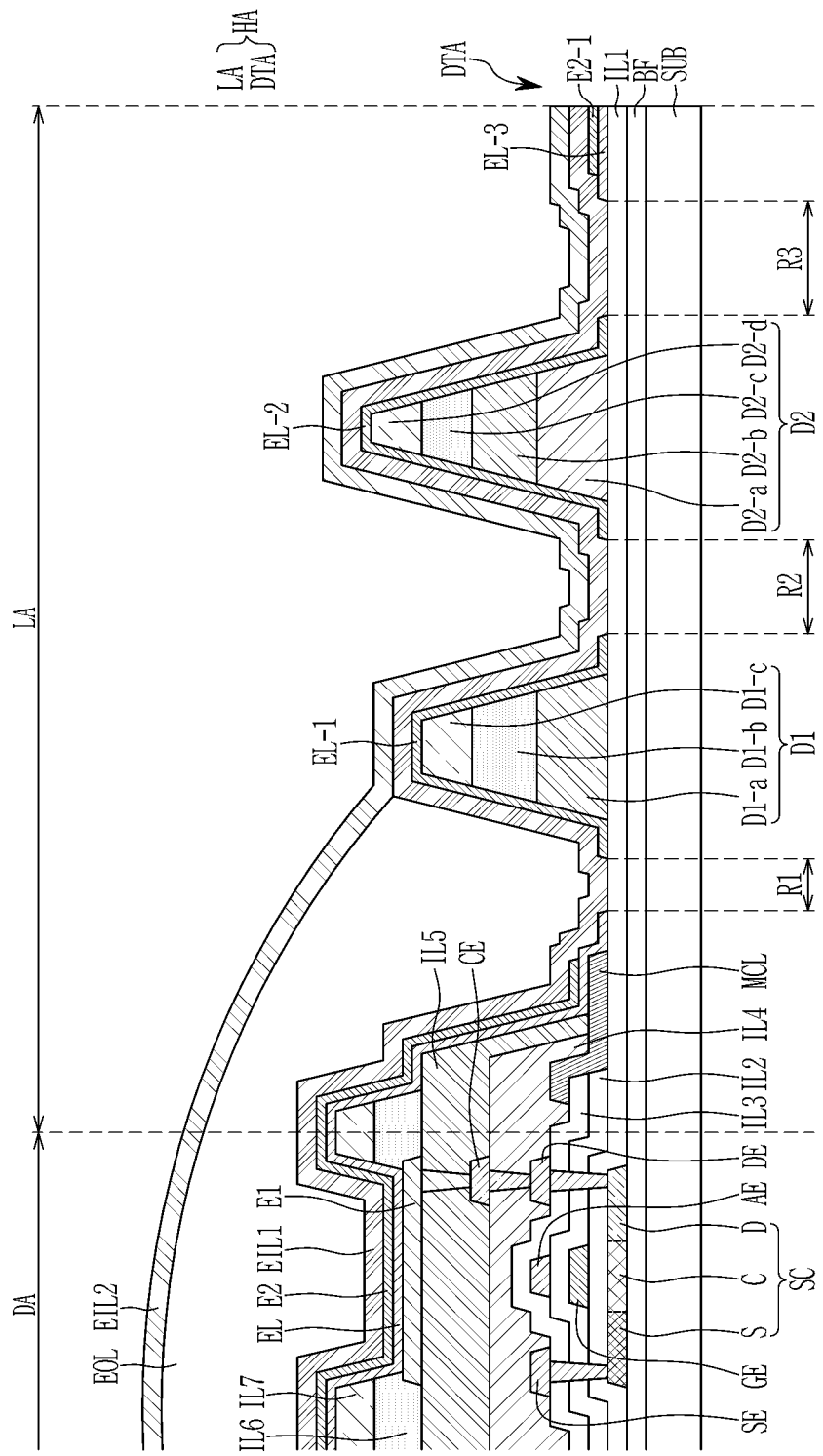
FIG. 5C is a cross-sectional view of a display panel in which a peripheral area and an opening area are positioned.
Figure 5D:
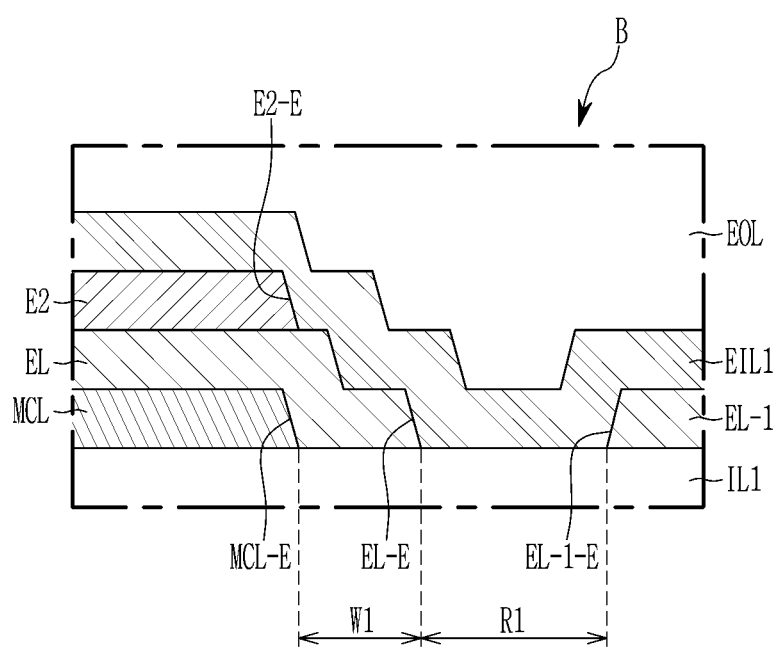
FIG. 5D is an enlarged view of an area in which an end of a second electrode is positioned.

Next, the area surrounding the opening area DTA is described with reference to FIG. 5A, FIG. 5C, and FIG. 5D. FIG. 5A is a cross-sectional view of a display panel corresponding to a display area, FIG. 5B is a circuit diagram of a display device according to an embodiment, FIG. 5C is a cross-sectional view of a display panel in which a peripheral area and an opening area are positioned, and FIG. 5D is an enlarged view of an area in which an end of a second electrode is positioned.

First, the stacked structure based on the display area DA is described with reference to FIG. 5A.

The substrate SUB according to an embodiment may include an inorganic insulating material such as glass or an organic insulating material of a plastic such as polyimide (PI). The substrate SUB may be single-layered or multi-layered. The substrate SUB may have a structure in which at least one base layer and at least one inorganic layer, including a polymer resin sequentially stacked, are alternately stacked.

The substrate SUB may have various degrees of flexibility. The substrate SUB may be a rigid substrate or a flexible substrate capable of bending, folding, or rolling.

A buffer film BF may be positioned on the substrate SUB. The buffer film BF blocks impurities from being transferred from the substrate SUB to the upper layer of the buffer film BF, particularly the semiconductor layer SC, thereby preventing a characteristic degradation of the semiconductor layer SC and reducing a stress. The buffer film BF may include an inorganic insulating material such as a silicon nitride or a silicon oxide or an organic insulating material. Some or all of the buffer film BF may be omitted.

The semiconductor layer SC is positioned on the buffer film BF. The semiconductor layer SC may include at least one of polysilicon and an oxide semiconductor. The semiconductor layer SC includes a channel area C, a first area S, and a second area D. The first area S and the second area D are disposed on both sides of the channel area C, respectively. The channel area C may include a semiconductor with a small amount of impurity doped compared to the first area S and the second area D or without being doped with impurities, and the first area S and the second area D may include a semiconductor doped with a large amount of the impurity compared to the channel area C. The semiconductor layer SC may be made of an oxide semiconductor, and in this case, a separate protective layer (not shown) may be added to protect the oxide semiconductor material that is vulnerable to external environments such as high temperature.

A first inorganic insulating layer IL1 is disposed on the semiconductor layer SC. The first inorganic insulating layer IL1 may be single-layered or multi-layered including at least one of a silicon oxide ($SiO_X$), a silicon nitride ($SiN_X$), and a silicon oxynitride ($SiO_XN_Y$).

A gate electrode GE and a first capacitor electrode CE1 are positioned on the first inorganic insulating layer IL1. The gate electrode GE and the first capacitor electrode CE1 may be single-layered or a multi-layered in which a metal film including any one of copper (Cu), a copper alloy, aluminum (Al), an aluminum alloy, molybdenum (Mo), and a molybdenum alloy is stacked. The gate electrode GE may overlap the channel area C of the semiconductor layer SC.

A second inorganic insulating layer IL2 is positioned on the gate electrode GE and the first inorganic insulating layer IL1. The second inorganic insulating layer IL2 may be single-layered or multi-layered including at least one of a silicon oxide ($SiO_X$), a silicon nitride ($SiN_X$), and a silicon oxynitride ($SiO_XN_Y$).

An upper electrode AE and a second capacitor electrode CE2 are positioned on the second inorganic insulating layer IL2. The second capacitor electrode CE2 and the upper electrode AE may be different parts of one conductive pattern. The second capacitor electrode CE2 and the upper electrode AE may be electrically connected.

The second capacitor electrode CE2 and the upper electrode AE may be a single-layer or multilayer in which a metal film including any one of copper (Cu), a copper alloy, aluminum (Al), an aluminum alloy, molybdenum (Mo), and a molybdenum alloy is stacked.

A third inorganic insulating layer IL3 is positioned on the upper electrode AE and the second capacitor electrode CE2. The third inorganic insulating layer IL3 may be a single layer or multi-layer including at least one of a silicon oxide ($SiO_X$), a silicon nitride ($SiN_X$), and a silicon oxynitride ($SiO_XN_Y$).

A source electrode SE and a drain electrode DE are positioned on the third inorganic insulating layer IL3. The source electrode SE and the drain electrode DE are connected to the first area S and the second area D of the semiconductor layer SC through contact holes formed in the third inorganic insulating layer IL3, and the first and second inorganic insulating layers IL1 and IL2, respectively.

The source electrode SE and the drain electrode DE may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), etc., and may be a single-layered or multi-layered structure.

A first organic insulating layer IL4 and a second organic insulating layer IL5 are sequentially positioned on the third inorganic insulating layer IL3, the source electrode SE, and the drain electrode DE. The first organic insulating layer IL4 and the second organic insulating layer IL5 may include an organic insulating material such as a generally-used polymer such as polymethylmethacrylate (PMMA) or polystyrene (PS), a polymer derivative having a phenol-based group, an acryl-based polymer, an imide-based polymer, a polyimide, an acryl-based polymer, and a siloxane-based polymer.

A connecting member CE may be positioned between the first organic insulating layer IL4 and the second organic insulating layer IL5. The connecting member CE may connect the drain electrode DE and the first electrode E1. However, the present invention is not limited thereto, and the drain electrode DE and the first electrode E1 may be directly connected without a connecting member according to an embodiment.

The first electrode E1 is positioned on the second organic insulating layer IL5. The first electrode E1 is connected to the connecting member CE through the contact hole of the second organic insulating layer IL5. The first electrode E1 is electrically connected to the drain electrode DE.

The first electrode E1 may include metals such as silver (Ag), lithium (Li), calcium (Ca), aluminum (Al), magnesium (Mg), and gold (Au), and it may also include a transparent conductive oxide (TCO) such as indium tin oxide (ITO) and indium zinc oxide (IZO). The first electrode E1 may consist of a single layer containing a metal material or a transparent conductive oxide, or a multilayer containing them. For example, the first electrode E1 may have a triple-layer structure of indium tin oxide (ITO)/silver (Ag)/indium tin oxide (ITO).

The transistor consisting of the gate electrode GE, the semiconductor layer SC, the source electrode SE, and the drain electrode DE is connected to the first electrode E1 to supply the current to the light-emitting element LD.

A pixel definition layer IL6 and a spacer IL7 are positioned on the second organic insulating layer IL5 and the first electrode E1.

The pixel definition layer IL6 overlaps at least a portion of the first electrode E1 and has an opening defining the light emitting area. The opening may have a planar shape similar to that of the first electrode E1. The opening may have a rhombus or octagonal shape similar to the rhombus in a plane, but is not limited thereto, and may have any shape such as a quadrangle, a polygon, a circle, or an ellipse.

The pixel definition layer IL6 and the spacer IL7 may include an organic insulating material such as a generally-used polymer such as polymethylmethacrylate (PMMA) or polystyrene (PS), a polymer derivative having a phenol-based group, an acryl-based polymer, an imide-based polymer, a polyimide, an acryl-based polymer, and a siloxane-based polymer.

The intermediate layer EL is positioned on the first electrode E1 overlapping the opening. The intermediate layer EL may include an emission layer and a functional layer.

The intermediate layer EL may generate a predetermined colored light. In this specification, the intermediate layer EL is shown to be positioned in the display area DA and the peripheral area LA, but at least some of the intermediate layer EL may be positioned only in the display area DA and not in the peripheral area LA. For example, the emission layer may be formed to be positioned only within the opening of the pixel definition layer IL6 by using a mask. At this time, the emission layer is positioned in the display area DA and not in the peripheral area LA. The functional layer may be positioned in the display area DA and the peripheral area LA.

The emission layer may include an organic material and/or an inorganic material. Also, the functional layer may include at least one among a hole injection layer (HIL), a hole transporting layer (HTL), an electron transporting layer (ETL), and an electron injection layer (EIL). The functional layer may be positioned between the first electrode E1 and the emission layer, or may be positioned between the emission layer and the second electrode E2. The functional layer may have a shape overlapping the entire surface of the substrate SUB. The functional layer may be disposed over a plurality of pixels.

This description is in which the intermediate layer EL overlaps the entire surface of the substrate SUB, which shows an embodiment in which the functional layer overlaps the entire surface of the substrate SUB. The emission layer may be formed only within the opening of the pixel definition layer IL6 as described above.

The second electrode E2 is positioned on the intermediate layer EL. The second electrode E2 may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), calcium (Ca), etc., or a transparent conductive oxide (TCO) such as indium tin oxide (ITO) and indium zinc oxide (IZO).

The first electrode E1, the intermediate layer EL, and the second electrode E2 may constitute the light emitting element LD. Here, first electrode E1 may be an anode, which is a hole injection electrode, and second electrode E2, may be a cathode, which is an electron injection electrode. However, in an embodiment, according to the driving method of the emissive display device, the first electrode E1 may be the cathode and the second electrode E2 may be the anode.

Holes and electrons are injected into the organic intermediate layer EL from the first electrode E1 and the second electrode E2, respectively, and light emission occurs when an exciton of which the injected hole and electron are combined falls from an excited state to a ground state.

An encapsulation layer ENC is positioned on the second electrode E2. The encapsulation layer ENC may cover the side of the light-emitting element LD as well as the upper surface, thereby sealing the light-emitting element LD. Since the light-emitting element is very vulnerable to moisture and oxygen, the encapsulation layer ENC seals the light-emitting element LD to block the inflow of moisture and oxygen from the outside.

The encapsulation layer ENC may include a plurality of layers and may be formed of a composite film including both an inorganic layer and an organic layer, for example, a first encapsulation inorganic layer EIL1 and an encapsulation organic layer EOL, and it may be formed of a triple layer in which a first encapsulation inorganic layer EIL1, an encapsulation organic layer EOL, and a second encapsulation inorganic layer EIL2 are sequentially formed.

The first encapsulation inorganic layer EIL1 may cover the second electrode E2. The first encapsulation inorganic layer EIL1 may prevent external moisture or oxygen from penetrating into the light-emitting element LD. For example, the first encapsulation inorganic layer EIL1 may include a silicon nitride, a silicon oxide, or a combination compound thereof. The first encapsulation inorganic layer EIL1 may be formed through a deposition process.

The encapsulation organic layer EOL is disposed on the first encapsulation inorganic layer EIL1 and may be in contact with the first encapsulation inorganic layer EIL1. A curvature formed on the upper surface of the first encapsulation inorganic layer EIL1 or particles present on the first encapsulation inorganic layer EIL1 are covered by the encapsulation organic layer EOL, so that it is possible to prevent the surface state of the upper surface of the first encapsulation inorganic layer EIL1 from affecting the components formed on the encapsulation organic layer EOL. In addition, the encapsulation organic layer EOL may alleviate the stress between contacting layers. The encapsulation organic layer EOL may include an organic material, and may be formed through a solution process such as spin coating, slit coating, or an inkjet process.

The second encapsulation inorganic layer EIL2 is disposed on the encapsulation organic layer EOL to cover the encapsulation organic layer EOL. The second encapsulation inorganic layer EIL2 may be stably formed on a relatively flat surface rather than being disposed on the first encapsulation inorganic layer EIL1. The second encapsulation inorganic layer EIL2 prevents an inflow to the outside by encapsulating moisture emitted from the encapsulation organic layer EOL. The second encapsulation inorganic layer EIL2 may include a silicon nitride, a silicon oxide, or a combination compound thereof. The second encapsulation inorganic layer EIL2 may be formed through a deposition process.

Additionally, a capping layer positioned between the second electrode E2 and the encapsulation layer ENC may be further included. The capping layer may include an organic material. The capping layer protects the second electrode E2 from a subsequent process, for example, a sputtering process, and improves light emission efficiency of the light-emitting element LD. The capping layer may have a refractive index greater than that of the first encapsulation inorganic layer EIL1.

Although one of the transistors included in one pixel has been described above, each pixel may include a plurality of transistors. In the following, examples of a plurality of transistors included in each pixel are described with reference to FIG. 5B.

As shown in FIG. 5B, one pixel PX of a display device according to an embodiment includes a plurality of transistors T1, T2, T3, T4, T5, T6, and T7, a storage capacitor Cst, a boost capacitor Cbt, and a light emitting diode (LED), which are connected to several wirings 127, 128, 151, 152, 153, 154, 155, 171, 172, and 741.

A plurality of wirings 127, 128, 151, 152, 153, 154, 155, 171, 172, and 741 are connected to one pixel PX. A plurality of wirings include a first initialization voltage line 127, a second initialization voltage line 128, a first scan signal line 151, a second scan signal line 152, an initialization control line 153, a bypass control line 154, a light emission control line 155, a data line 171, a driving voltage line 172, and a common voltage line 741.

The first scan signal line 151 is connected to the gate driver and transmits the first scan signal GW to the second transistor T2. A voltage of the opposite polarity to the voltage applied to the first scan signal line 151 may be applied to the second scan signal line 152 at the same timing as the signal of the first scan signal line 151. For example, when a negative voltage is applied to the first scan signal line 151, a positive voltage may be applied to the second scan signal line 152. The second scan signal line 152 transmits the second scan signal GC to the third transistor T3.

The initialization control line 153 transmits an initialization control signal GI to the fourth transistor T4. The bypass control line 154 transmits the bypass signal GB to the seventh transistor T7. The bypass control line 154 may be formed of the first scan signal line 151 of the previous state. The light emission control line 155 transmits the light emission control signal EM to the fifth transistor T5 and the sixth transistor T6.

The data line 171 is a wire that transmits a data voltage DATA generated from a data driver (not shown), and the luminance emitted by the light emitting diode (LED) changes according to the data voltage DATA applied to the pixel PX.

The driving voltage line 172 applies the driving voltage ELVDD. The first initialization voltage line 127 transmits the first initialization voltage VINT, and the second initialization voltage line 128 transmits the second initialization voltage AINT. The common voltage line 741 applies the common voltage ELVSS to the cathode of the light emitting diode (LED). In the embodiment described herein, the voltages applied to the driving voltage line 172, the first and second initialization voltage lines 127 and 128, and the common voltage line 741 may be constant voltages, respectively.

A plurality of transistors may include a driving transistor T1, a second transistor T2, a third transistor T3, a fourth transistor T4, a fifth transistor T5, a sixth transistor T6, and a seventh transistor T7. A plurality of transistors may include an oxide transistor including an oxide semiconductor and a silicon transistor including a polycrystalline silicon semiconductor. For example, the third transistor T3 and the fourth transistor T4 may be made of the oxide transistors, and the driving transistor T1, the second transistor T2, the fifth transistor T5, the sixth transistor T6, and the seventh transistor T7 may be made of the silicon transistors. However, the present invention is not limited thereto, and a plurality of transistors may all be formed of the silicon transistors.

In the above, it has been described that one pixel PX includes seven transistors T1 to T7, one storage capacitor Cst, and one boost capacitor Cbt, but is not limited thereto, and the number of transistors and capacitors and their connection relationships may be changed in many ways.

Next, the opening area DTA and the hole area HA including the peripheral area LA of the opening area DTA are described with reference to FIG. 5C and FIG. 5D. The description of the same constituent elements as in the above description is omitted.

First, in the peripheral area LA, the buffer film BF and the first inorganic insulating layer IL1 may be disposed on the substrate SUB. The buffer film BF and the first inorganic insulating layer IL1 may have a form extending from the display area DA. The embodiments described herein show the buffer film BF and the first inorganic insulating layer IL1 extend to the peripheral area LA, however it is not limited thereto, and at least one or more of the buffer film BF, the first inorganic insulating layer IL1, the second inorganic insulating layer IL2, and the third inorganic insulating layer IL3 may extend to the peripheral area LA.

According to an embodiment, the first metal layer MCL may be positioned in the peripheral area LA. The first metal layer MCL may be disposed on the first inorganic insulating layer IL1 overlapping the peripheral area LA. The first metal layer MCL may overlap the end of the second inorganic insulating layer IL2 and the third inorganic insulating layer IL3 extending to the peripheral area LA. The first metal layer MCL may have a structure having a step difference while overlapping the upper surface of the third inorganic insulating layer IL3 and the upper surface of the first inorganic insulating layer IL1 positioned in the peripheral area LA. However, it is not limited to this type, and the shape of the first metal layer MCL may be changed according to the shape of the peripheral area LA of the display panel.

The first metal layer MCL may include silver (Ag) or aluminum (Al), but is not limited thereto, and may include various metals such as titanium (Ti) or molybdenum (Mo).

On the first metal layer MCL, the first organic insulating layer IL4, the second organic insulating layer IL5, the pixel definition layer IL6, and the spacer IL7 extending from the display area DA may be disposed. The end of the first organic insulating layer IL4 and the second organic insulating layer IL5 may extend to the peripheral area LA with the shape covering the part of the first metal layer MCL, however it is not limited thereto.

The first organic insulating layer IL4, the second organic insulating layer IL5, the pixel definition layer IL6, and the spacer IL7 may extend to the end of the first metal layer MCL. The end of the first metal layer MCL may be separated from the first organic insulating layer IL4, the second organic insulating layer IL5, the pixel definition layer IL6, and the spacer IL7.

The intermediate layer EL may extend from the display area DA to a portion of the peripheral area LA. Referring to FIG. 5C and FIG. 5D, the end EL-E of the intermediate layer EL may cover the end MCL-E of the first metal layer MCL. The end EL-E of the intermediate layer EL may have a shape protruded toward the opening area DTA more than the end MCL-E of the first metal layer MCL.

The second electrode E2 positioned on the intermediate layer EL may extend from the display area DA to a portion of the peripheral area LA. The end E2-E of the second electrode E2, as shown in FIG. 5D, may substantially match the end MCL-E of the first metal layer MCL. The end E2-E of the second electrode E2 may be substantially aligned with the end MCL1-E of the first metal layer MCL. In this and other embodiments described herein, to be substantially aligned may denote that the end E2-E of the second electrode E2 matches the end MCL1-E of the first metal layer MCL, or that one of the ends is finely protruded.

The end E2-E of the second electrode E2 may have a flat shape. The second electrode E2 may be formed through laser irradiation on some areas after forming the second electrode material layer in the manufacturing process. The laser irradiation removes unnecessary portions of the second electrode material layer. At this time, the end of the second electrode E2 may be formed in a shape including a burr. That is, the second electrode E2 having a fairly thin thickness may have a shape in which the end is rolled up by heat transferred from the laser. However, according to an embodiment, the second electrode E2 may overlap the first metal layer MCL, and the first metal layer MCL may block heat transmitted to the second electrode E2 by the laser. The intermediate layer EL and second electrode E2 overlapping the first metal layer MCL may minimize a shape deformation. Particularly, the second electrode E2 overlapping the first metal layer MCL may be provided in a flat shape without rolling up.

At least two more dams D1 and D2 may be positioned in the peripheral area LA. For example, a first dam D1 and a second dam D2 may be positioned in the order adjacent to the display area DA. The first dam D1 and the second dam D2 may be positioned in the peripheral area LA and may be positioned on the first inorganic insulating layer IL1.

The first dam D1 may include a first-first sub-dam D1-*a*, a first-second sub-dam D1-*b*, and a first-third sub-dam D1-*c*. The first-first sub-dam D1-*a* may be positioned on the same layer as the second organic insulating layer IL5 positioned in the display area DA and may include the same material. The first-first sub-dam D1-*a* may be formed in the same process as the second organic insulating layer IL5 positioned in the display area DA. The first-second sub-dam D1-*b* may be positioned on the same layer as the pixel definition layer IL6 positioned in the display area DA and may include the same material. The first-second sub-dam D1-*b* may be formed in the same process as the pixel definition layer IL6 positioned in the display area DA. The first-third sub-dam D1-*c* may be positioned on the same layer as the spacer IL7 positioned in the display area DA and may include the same material. The first-third sub-dam D1-*c* may be formed in the same process as the spacer IL7 positioned in the display area DA.

The second dam D1 may include a second-first sub-dam D2-*a*, a second-second sub-dam D2-*b*, a second/third sub-dam D2-*c*, and a second/fourth sub-dam D2-*d*. The second-first sub-dam D2-*a* may be positioned on the same layer as the first organic insulating layer IL4 positioned in the display area DA and may include the same material. The second-first sub-dam D2-*a* may be formed in the same process as the first organic insulating layer IL4 positioned in the display area DA. The second-second sub-dam D2-*b* may be positioned on the same layer as the second organic insulating layer IL5 positioned in the display area DA and may include the same material. The second-second sub-dam D2-*b* may be formed in the same process as the second organic insulating layer IL5 positioned in the display area DA. The second/third sub-dam D2-*c* may be positioned on the same layer as the pixel definition layer IL6 positioned in the display area DA and may include the same material. The second/third sub-dam D2-*c* may be formed in the same process as the pixel definition layer IL6 positioned in the display area DA. The second/fourth sub-dam D2-*d* may be positioned on the same layer as the spacer IL7 positioned in the display area DA and may include the same material. The second/fourth sub-dam D2-d may be formed in the same process as the spacer IL7 positioned in the display area DA.

The embodiments described herein show the first dam D1 formed in a triple-layered structure and the second dam D2 formed in a quadruple-layered structure. However, it is not limited thereto, and the positions may be changed as the first dam D1 is formed in a quadruple structure and the second dam D2 is formed in a triple layer structure, or both the first dam D1 and the second dam D2 may be formed in a triple layer structure, or both the first dam D1 and the second dam D2 may be formed in a quadruple structure. In addition, it goes without saying that the dam having a double-layered structure including only a part of the above-described sub-dam may be provided. In addition, although this specification shows an embodiment in which two dams D1 and D2 are positioned in the peripheral area LA, the number is not limited and two or more dams may be positioned in the peripheral area LA.

Also, the dams D1 and D2 described herein, and as shown in FIG. 4, have a ring shape surrounding the opening area DTA on a plane. However, this is an illustrative shape and the first dam D1 and second dam D2 may have a different shape from the opening area DTA. For example, the first dam D1 and the second dam D2 may have a shape including a polygon, an ellipse, or a closed line shape including at least some curved lines, or may be provided in a shape including a plurality of patterns that are partially disconnected, and it is not limited to any one embodiment.

The first-first layer EL-1 may be positioned on the first dam D1. The first-second layer EL-2 may be positioned on the second dam D2. The first-third layer EL-3 may be positioned between the second dam D2 and the opening area DTA. The first-first layer EL-1, the first-second layer EL-2, and the first-third layer EL-3 may include the same material as the intermediate layer EL and may be formed in the same process.

The first-first layer EL-1, the first-second layer EL-2, and the first-third layer EL-3 may include at least a part of the functional layers among the intermediate layer EL. Particularly, the first-first layer EL-1, the first-second layer EL-2, and the first-third layer EL-3 may include at least one of the hole injection layer, the hole transporting layer, the electron transporting layer, and the electron injection layer. The intermediate layer EL and the first-first layer EL-1 may be separated. The first inorganic insulating layer IL1 may be exposed in an area where the intermediate layer EL and the first-first layer EL-1 are spaced apart from each other. The spaced area between the end EL-E of the intermediate layer EL and the end EL-1-E of the first-first layer EL-1 may be a first opening area R1.

Referring to FIG. 5D, a minimum distance W1 between the end EL-E of the intermediate layer EL and the end MCL-E of the first metal layer MCL may be about 35 micrometers or more. When the minimum distance W1 is smaller than about 35 micrometers, it may be difficult to control the process of separating a sacrificial layer in the manufacturing process. It may not be easy to control the process of separating only the sacrificial layer and maintaining the first metal layer MCL and the second electrode.

The first-first layer EL-1 and the first-second layer EL-2 may be spaced apart from each other. As the first-first layer EL-1 and the first-second layer EL-2 are spaced apart from each other, a part of the first inorganic insulating layer IL1 may be exposed. The first-first layer EL-1 and the first-second layer EL-2 are spaced apart from each other so that an area where the first inorganic insulating layer IL1 is exposed may be a second opening area R2.

The first-second layer EL-2 and the first-third layer EL-3 may be spaced apart from each other. As the first-second layer EL-2 and the first-third layer EL-3 are spaced apart from each other, a part of the first inorganic insulating layer IL1 may be exposed. The first-second layer EL-2 and the first-third layer EL-3 are spaced apart from each other so that an area where the first inorganic insulating layer IL1 is exposed may be a third opening area R3.

The first opening area R1, the second opening area R2, and the third opening area R3 are areas from which an intermediate material layer is removed and may block a path of foreign particles penetrating from the outside along the intermediate material layer.

A portion of the second electrode E2 extending from the display area DA may be positioned in the peripheral area LA. In addition, the second-first layer E2-1 may be positioned in the peripheral area LA. The second-first layer E2-1 may include the same material as the second electrode E2 and may be formed in the same process.

This specification describes an embodiment in which the second-first layer E2-1 and the first-third layer EL-3 are formed in the area adjacent to the opening area DTA, but is not limited thereto, and the second-first layer E2-1 and the first-third layer EL-3 may be omitted depending on the design according to the manufacturing process. When the second-first layer E2-1 and the first-third layer EL-3 are omitted, the third opening area R3 may be extended. In the third opening area R3, the substrate SUB, the buffer film BF, the first inorganic insulating layer IL1, the first encapsulation inorganic layer EIL1, and the second encapsulation inorganic layer EIL2 may be stacked.

In the peripheral area LA, the first encapsulation inorganic layer EIL1 extending from the display area DA may be positioned. In addition, the end of the encapsulation organic layer EOL extending from the display area DA may be positioned. The first dam D1 may control the spread of the material in the process of forming the encapsulation organic layer EOL. The encapsulation organic layer EOL may have a shape that fills the space between the end of the display area DA and the first dam D1. On the encapsulation organic layer EOL, a second encapsulation inorganic layer EIL2 overlapping the entire surface of the substrate SUB may be positioned.

In the first opening area R1, the first encapsulation inorganic layer EIL1, the encapsulation organic layer EOL, and the second encapsulation inorganic layer EIL2 may be positioned on the first inorganic insulating layer IL1. Also, in the second opening area R2, the first encapsulation inorganic layer EIL1 and the second encapsulation inorganic layer EIL2 may be positioned on the first inorganic insulating layer IL1. Further, in the third opening area R3, the first encapsulation inorganic layer EIL1 and the second encapsulation inorganic layer EIL2 may be positioned on the first inorganic insulating layer IL1.

The first electronic module described above may be inserted in an area overlapping the opening area DTA. The inner surface of the opening area DTA may be defined by the substrate SUB, the buffer film BF, the first inorganic insulating layer IL1, the end of the first-third layer EL-3, the end of the second-first layer E2-1, the first encapsulation inorganic layer EIL1, and the end of the second encapsulation inorganic layer EIL2. The substrate SUB, the buffer film BF, the first inorganic insulating layer IL1, the end of the first-third layer EL-3, the end of the second-first layer E2-1, the first encapsulation inorganic layer EIL1, and the end of the second encapsulation inorganic layer EIL2 are aligned with each other to form the opening area DTA. However, it is not limited thereto, and of course, some of the aforementioned constituent elements may be omitted or added to form the inner surface of the opening area DTA.

Next, the display device according to an embodiment is described with reference to FIG. 6 to FIG. 11. FIG. 6, FIG. 7, FIG. 8, FIG. 9, FIG. 10, and FIG. 11 are cross-sectional views of some area of a display panel according to a manufacturing process, respectively. Descriptions of the same configuration elements as those of the above-described configuration elements will be omitted.

Figure 6:
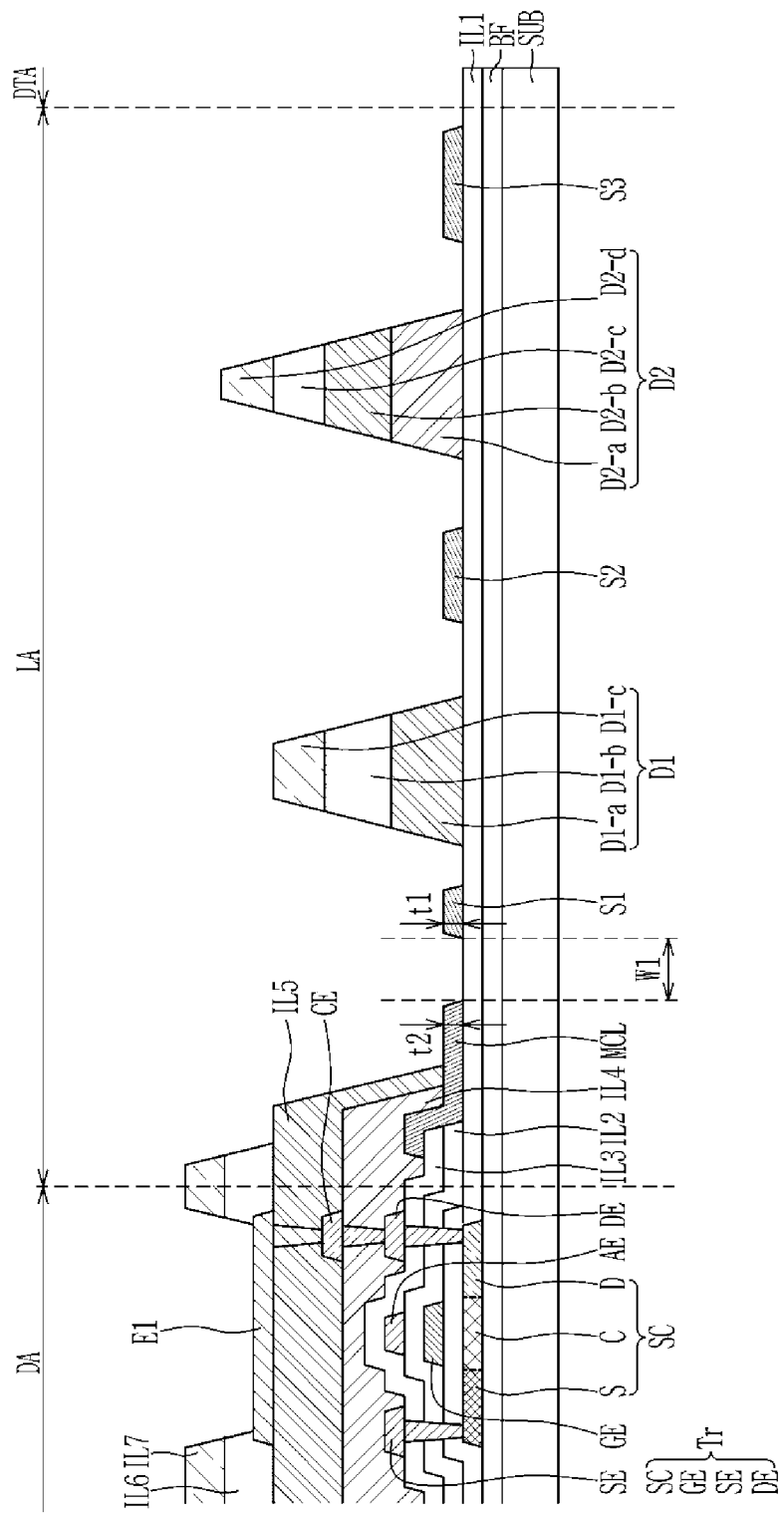
FIG. 6, FIG. 7, FIG. 8, FIG. 9, FIG. 10, and FIG. 11 are cross-sectional views of some area of a display panel according to a manufacturing process, respectively.

First, as shown in FIG. 6, the display device according to an embodiment forms a transistor Tr overlapping the display area DA and disposed on a substrate SUB, and a first electrode E1 connected to the transistor Tr. The transistor Tr and the first electrode E1 may be formed by patterning a conductive material.

A pixel definition layer IL6 and a spacer IL7 may be formed on the first electrode E1. The pixel definition layer IL6 may be formed to include an opening exposing at least a part of the first electrode E1. At the same time, a first dam D1 and a second dam D2 may be formed in the peripheral area LA. The first dam D1 and the second dam D2 may be formed into a multi-layered structure containing an organic material.

Then, a plurality of sacrificial layers S1, S2, and S3 are formed in the peripheral area LA. The sacrificial layers S1, S2, and S3 may include a metal material, and for example may include any one of silver (Ag), titanium (Ti), and molybdenum (Mo). When the sacrificial layers S1, S2, and S3 include silver (Ag) as an example, the thickness t1 of the sacrificial layers S1, S2, and S3 may be about 800 angstroms to 1000 angstroms. When the sacrificial layers S1, S2, and S3 include titanium (Ti) or molybdenum (Mo) as an example, the thickness t1 of the sacrificial layers S1, S2, and S3 may be about 200 angstroms to 300 angstroms. However, it is not limited to this range of thicknesses and may be changed according to embodiments, and the thinner the thickness, the easier the sacrificial layer may be separated by a laser irradiation process to be described later.

The first sacrificial layer S1 is positioned between the first metal layer MCL and the first dam D1. The second sacrificial layer S2 is positioned between the first dam D1 and the second dam D2. The third sacrificial layer S3 is positioned between the second dam D2 and the area where an opening area DTA will be formed. Although embodiments described herein show one sacrificial layer positioned in each area, a plurality of sacrificial layers may be disposed in one area according to design. For example, a plurality of third sacrificial layers may be positioned in an area where the second dam D2 and the opening area DTA will be formed.

Meanwhile, the first metal layer MCL positioned in the peripheral area LA may be formed simultaneously with the source electrode SE and the drain electrode DE, but is not limited thereto, and may be formed through a separate process. The first metal layer MCL may include silver (Ag) or aluminum (Al). When the first metal layer MCL includes silver (Ag), the thickness t2 of the first metal layer MCL may be about 800 angstroms to about 1000 angstroms. The thicker the first metal layer MCL, the easier it may be to block heat.

The distance W1 between the end of the first sacrificial layer S1 and the end of the first metal layer MCL may be changed according to a material included in the first sacrificial layer S1 and a material included in the first metal layer MCL. For example, when the material included in the first sacrificial layer S1 and the material included in the first metal layer MCL have excellent laser selectivity, the first sacrificial layer S1 and the first metal layer MCL may be disposed in a fairly close form. This is because it is possible to remove the first sacrificial layer S1 without excessive laser irradiation or heat transferring to the first metal layer MCL. When the material included in the first sacrificial layer S1 and the material included in the first metal layer MCL are the same, a predetermined separation distance is required between the first sacrificial layer S1 and the first metal layer MCL. This is because the first metal layer MCL should not have excessive heat transfer while the first sacrificial layer S1 is sufficiently removed by the irradiated laser. In the case of an embodiment, the separation distance W1 between the first sacrificial layer S1 and the first metal layer MCL may be about 35 micrometers or more. However, it is not limited to this distance and may be changed according to various conditions such as a processing precision of manufacturing equipment, a size of laser beam, and a pitch of a shot.

Figure 7:
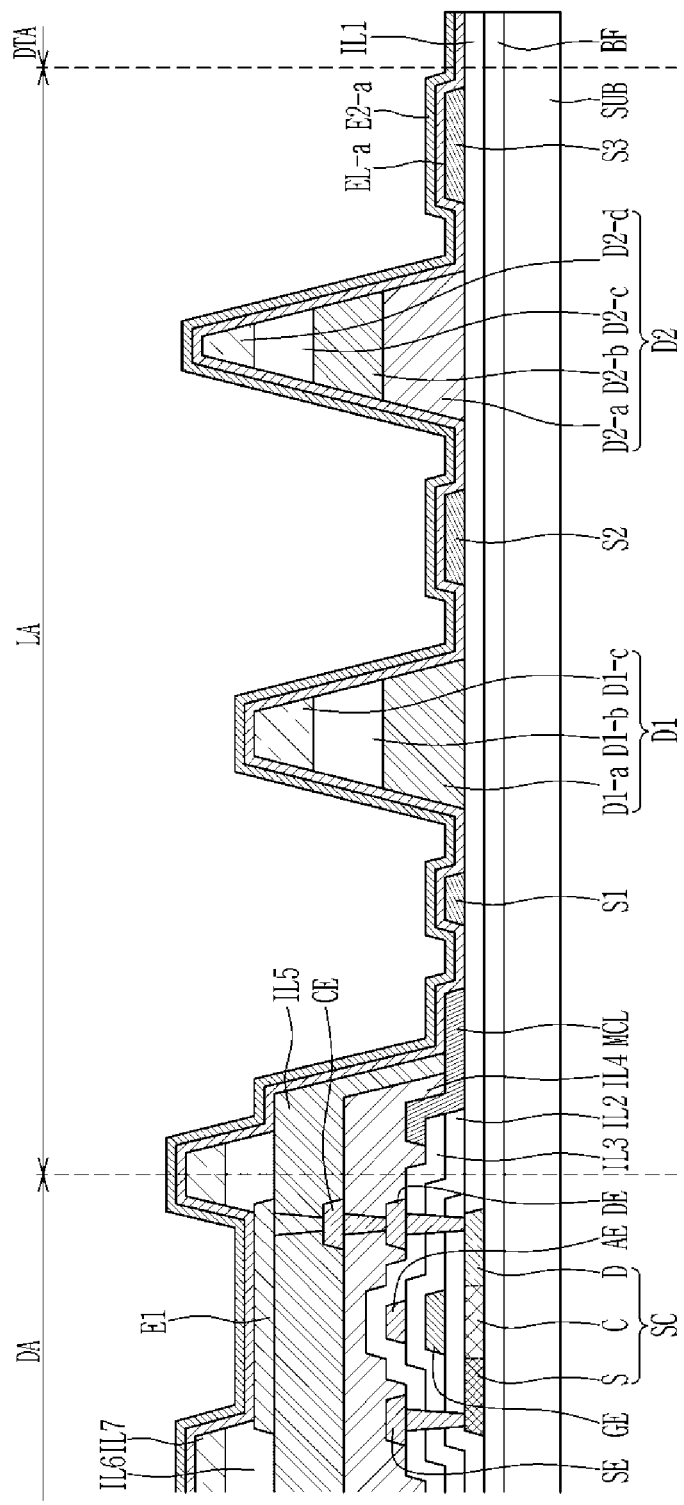

Next, as shown in FIG. 7, an intermediate material layer EL-a and a second electrode material layer E2-a are formed by a deposition process.

The intermediate material layer EL-a may include an emission layer formed to be positioned only in the opening of the pixel definition layer IL6 by using a mask, and a functional material layer formed to overlap the entire surface of the substrate SUB. The functional material layer may include a material layer for forming at least one of the hole injection layer (HIL), the hole transporting layer (HTL), the electron transporting layer (ETL), and the electron injection layer (EIL) as above-described.

Further, the emission layer positioned only in the opening is not separately shown, and the intermediate material layer EL-a is shown to overlap the entire surface of the substrate SUB. This denotes that the functional material layer overlaps the entire surface of the substrate SUB and the emission layer positioned only in the opening is omitted.

Figure 8:
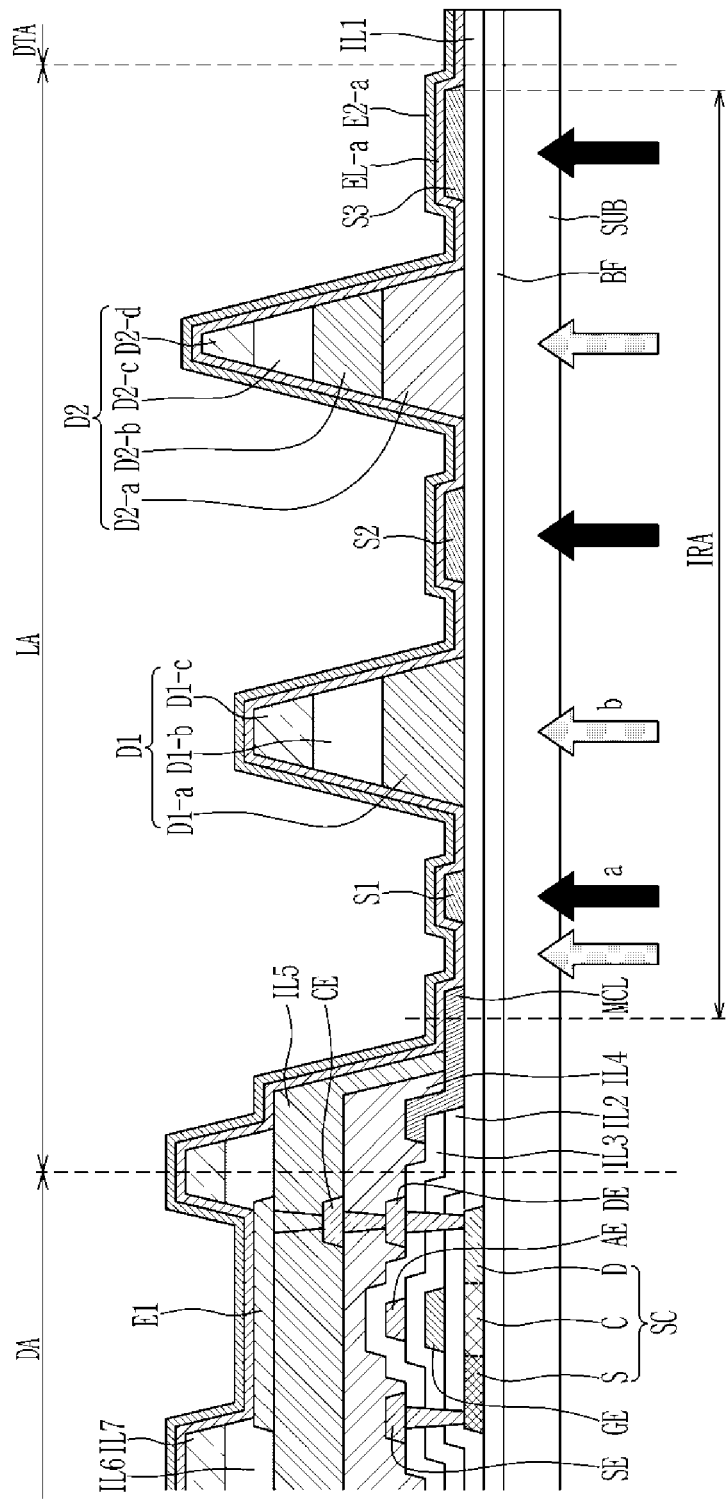

Then, as shown in FIG. 8, a laser is irradiated to a part IRA of the peripheral area LA. The area IRA to which the laser is irradiated may be irradiated with lasers having different energy densities (ED) according to an embodiment. For example, a laser (a) having a high energy density may be irradiated to an area where the sacrificial layers S1, S2, and S3 are positioned, and a laser (b) having a low energy density may be irradiated to other areas. The laser may be irradiated in a direction from the display area DA toward the area where the opening area DTA will be formed.

Figure 9:
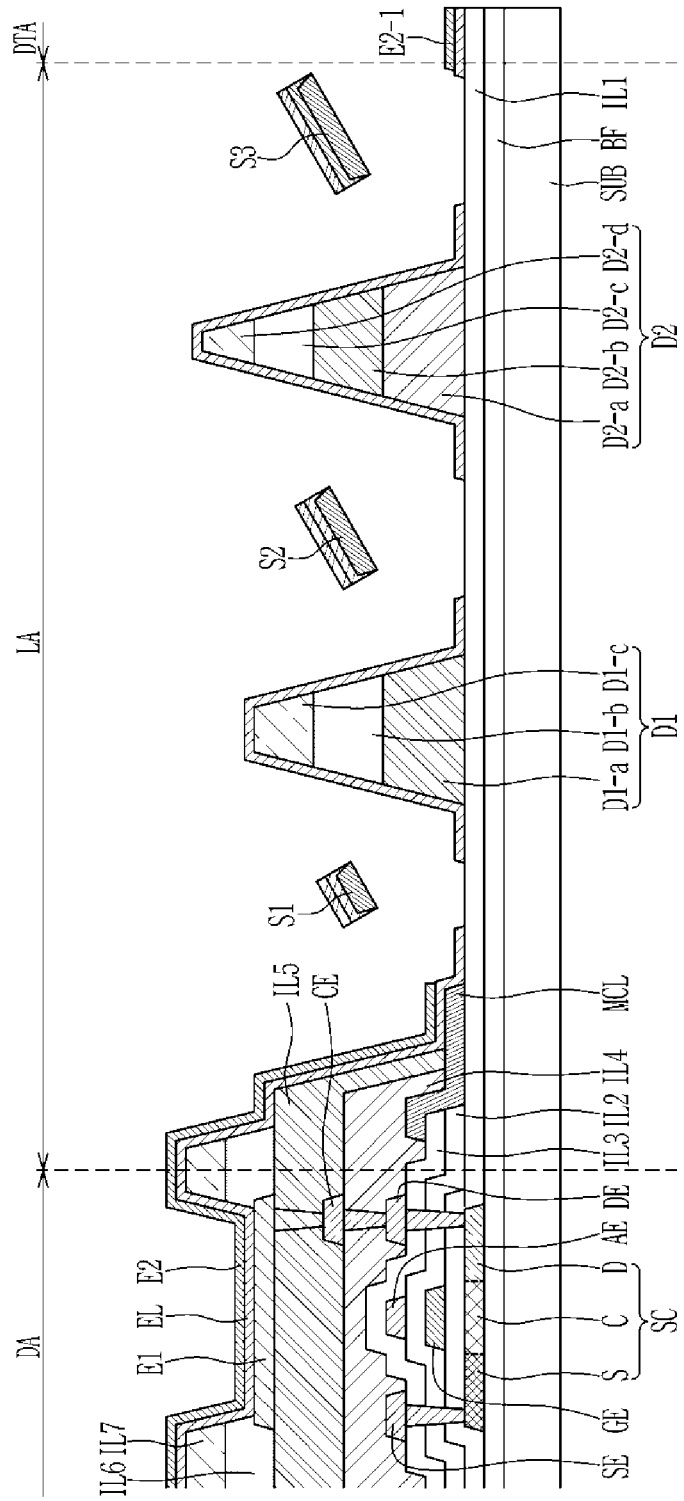

Through this laser irradiation process, as shown in FIG. 9, the sacrificial layers S1, S2, and S3 are separated from the first inorganic insulating layer IL1. Through laser ablation, the sacrificial layers S1, S2, and S3 are separated from the first inorganic insulating layer IL1, and the intermediate material layer and the second electrode material layer positioned on the sacrificial layers S1, S2, and S3 are also separated. Also, the second electrode material layer is removed in the area where the sacrificial layers S1, S2, and S3 are not positioned, but the laser is irradiated, so that the second electrode E2 and the second-first layer E2-1 may be formed.

Figure 10:
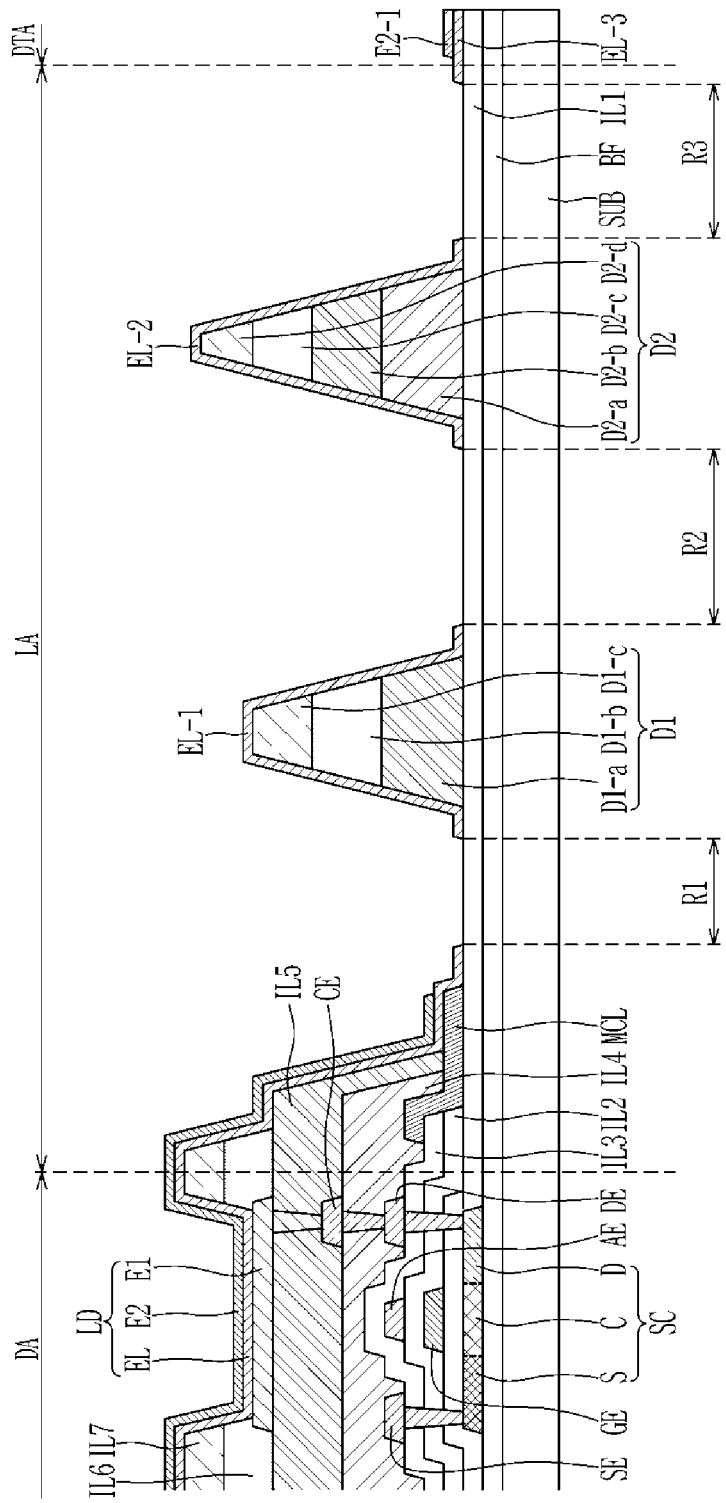

Through the laser irradiation process and the sacrificial layer removal, as shown in FIG. 10, in the peripheral area LA, the first-first layer EL-1, the first-second layer EL-2, and the first-third layer EL-3 are formed. Also, the second-first layer E2-1 positioned on the first-third layer EL-3 is formed. In the display area DA, a light-emitting element LD including the first electrode E1, the intermediate layer EL, and the second electrode E2 is formed.

A first opening area R1 may be formed between the intermediate layer EL and the first-first layer EL-1, a second opening area R2 may be formed between the first-first layer EL-1 and the first-second layer EL-2, and a third opening area R3 may be formed between the first-second layer EL-2 and the first-third layer EL-3. Each opening area R1, R2, and R3 may expose the first inorganic insulating layer IL1 and may be an area in which the intermediate material layer is shorted.

The intermediate layer EL and the end of the second electrode E2 may extend to a portion of the peripheral area LA. At this time, the end of the second electrode E2 may be formed in a flat shape without a rolling up phenomena because heat is blocked by the first metal layer MCL. In addition, since the intermediate layer EL is removed from the area where the sacrificial layer is separated, it may be formed of a shape covering the end of the first metal layer MCL.

Figure 11:
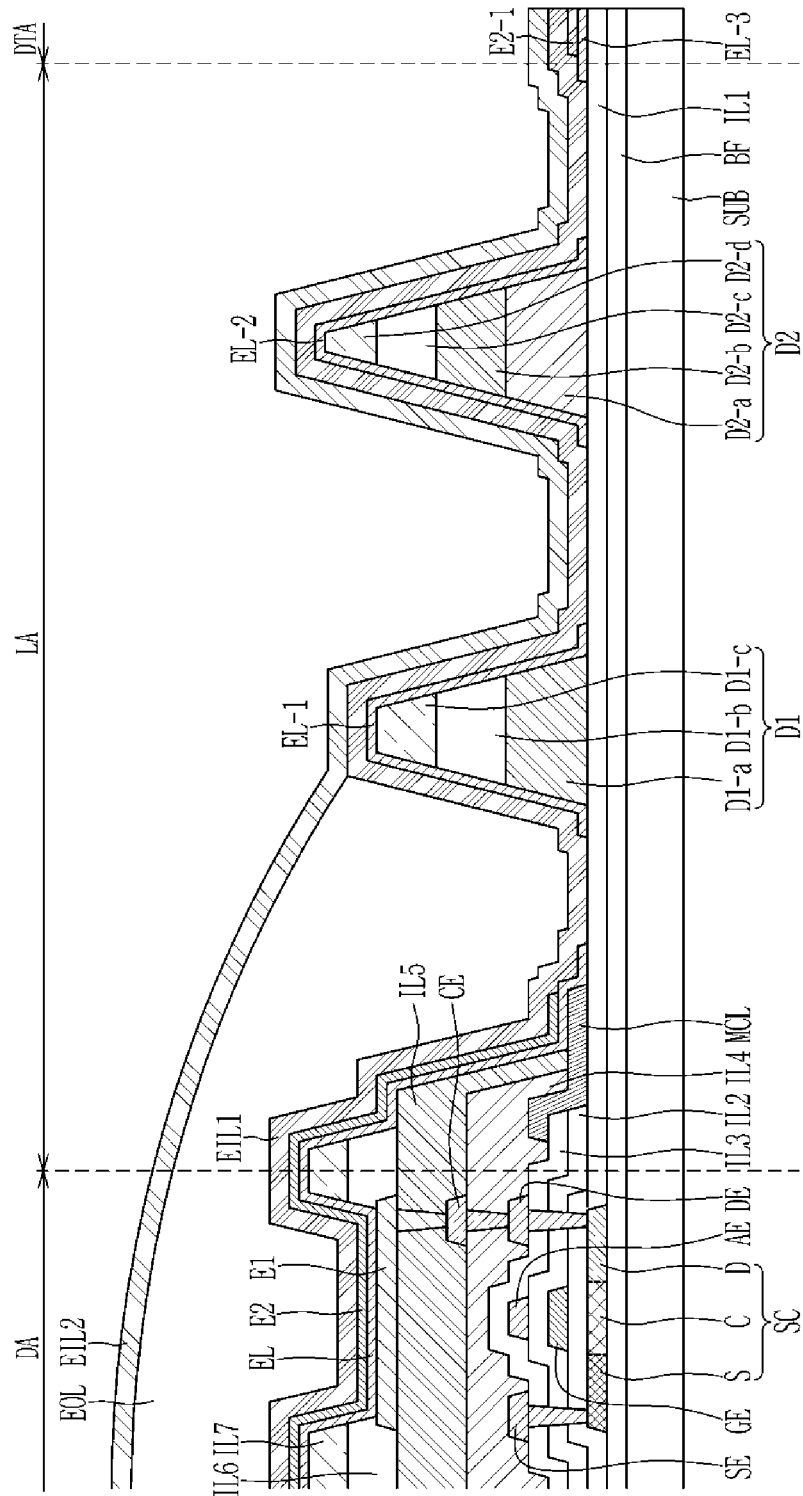

Then, as shown in FIG. 11, a first encapsulation inorganic layer EIL1 may be formed on the entire surface of the substrate SUB. In addition, the encapsulation organic layer EOL may be formed to be positioned in a portion of the peripheral area LA while overlapping the display area DA. In the process of forming the encapsulation organic layer EOL, the liquid organic material may be prevented from spreading by the dams D1 and D2. The encapsulation organic layer EOL may be formed by an inkjet method in which a liquid organic material is applied on the first encapsulation inorganic layer EIL1. At this time, the dams D1 and D2 set the boundary of the area where the organic material of the liquid is coated, and prevents the organic material of the liquid from overflowing to the outside of the dams D1 and D2. After that, a second encapsulation inorganic layer EIL2 may be formed on the encapsulation organic layer EOL so as to overlap the entire surface of the substrate SUB. The first encapsulation inorganic layer EIL1 and the second encapsulation inorganic layer EIL2 may be in contact with each other in the peripheral area LA.

Then, the opening area DTA is formed, thereby forming a structure like in FIG. 5C. The opening area DTA may be formed to penetrate the display panel. The opening area DTA may be formed by a laser or drilling process. The opening area DTA may be equipped with the first electronic module described above. The opening area DTA may be formed of an aligned inner surface of the end of the substrate SUB, the end of the buffer film BF, the end of the first inorganic insulating layer IL1, the end of the first-third layer EL-3, the end of the second-first layer E2-1, the end of the first encapsulation inorganic layer EIL1, and the end of the second encapsulation inorganic layer EIL2.

Hereinafter, the display device according to an embodiment is described with reference to FIG. 12A to FIG. 12D. FIG. 12A, FIG. 12B, FIG. 12C, and FIG. 12D are cross-sectional views of a display panel according to an embodiment, respectively. Description of the same constituent elements as the above-described constituent elements is omitted.

Figure 12A:
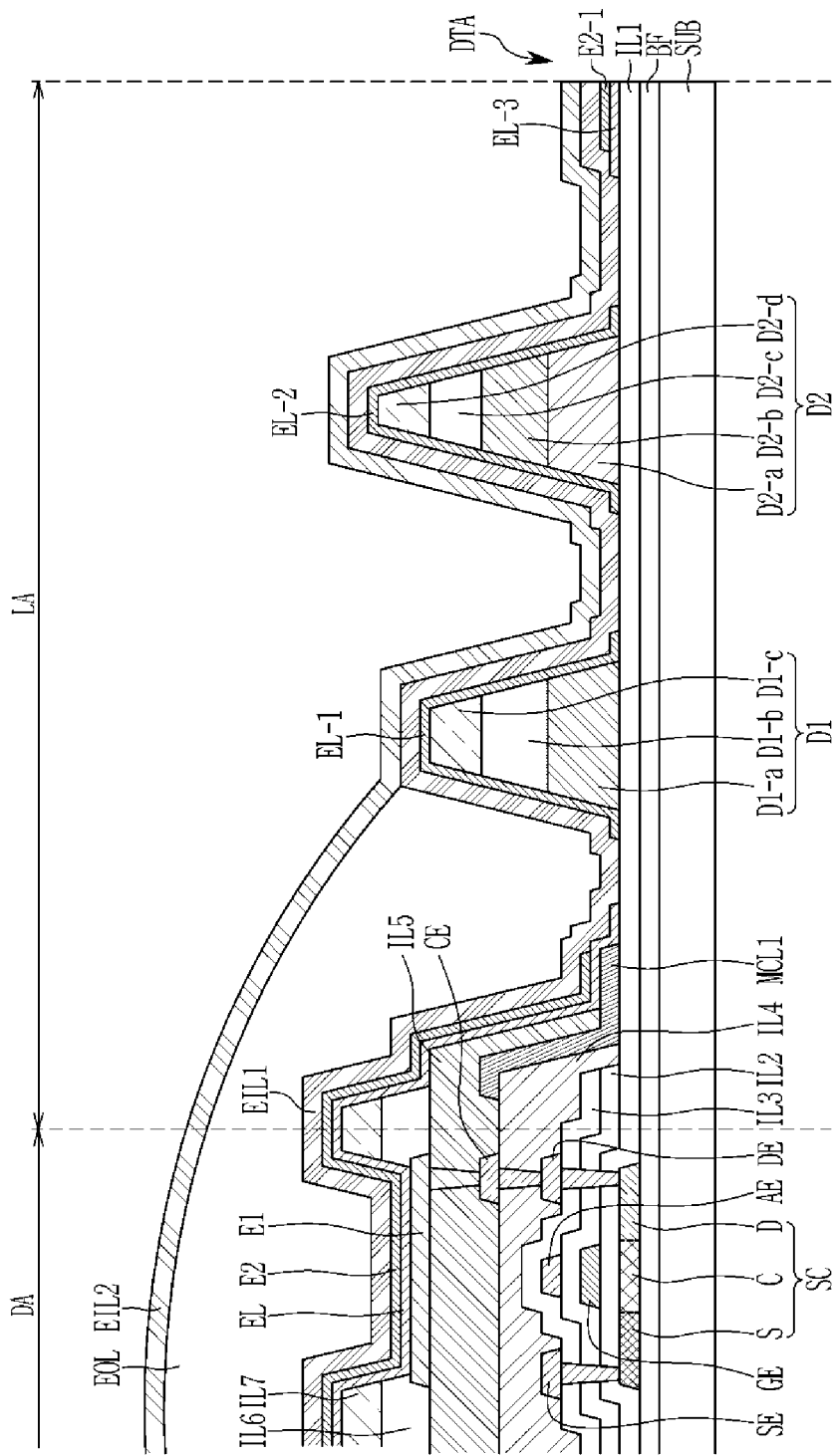
FIG. 12A, FIG. 12B, FIG. 12C, and FIG. 12D are cross-sectional views of a display panel according to an embodiment, respectively.

Referring to FIG. 12A, the first metal layer MCL1 according to an embodiment may overlap a part of the first organic insulating layer IL4. In detail, one end of the first metal layer MCL1 may be disposed on the upper surface of the first organic insulating layer IL4 and may have a shape that is in contact with the upper surface of the first inorganic insulating layer IL1 disposed in the peripheral area LA while extending along the side of the first organic insulating layer IL4.

The first metal layer MCL1 may be formed after forming the first organic insulating layer IL4 and before forming the second organic insulating layer IL5. The first metal layer MCL1 may include the same material as the connecting member CE and may be manufactured in the same process. However, it is not limited thereto, and may be manufactured through a process using a different mask even though it is positioned on the same layer.

Figure 12B:
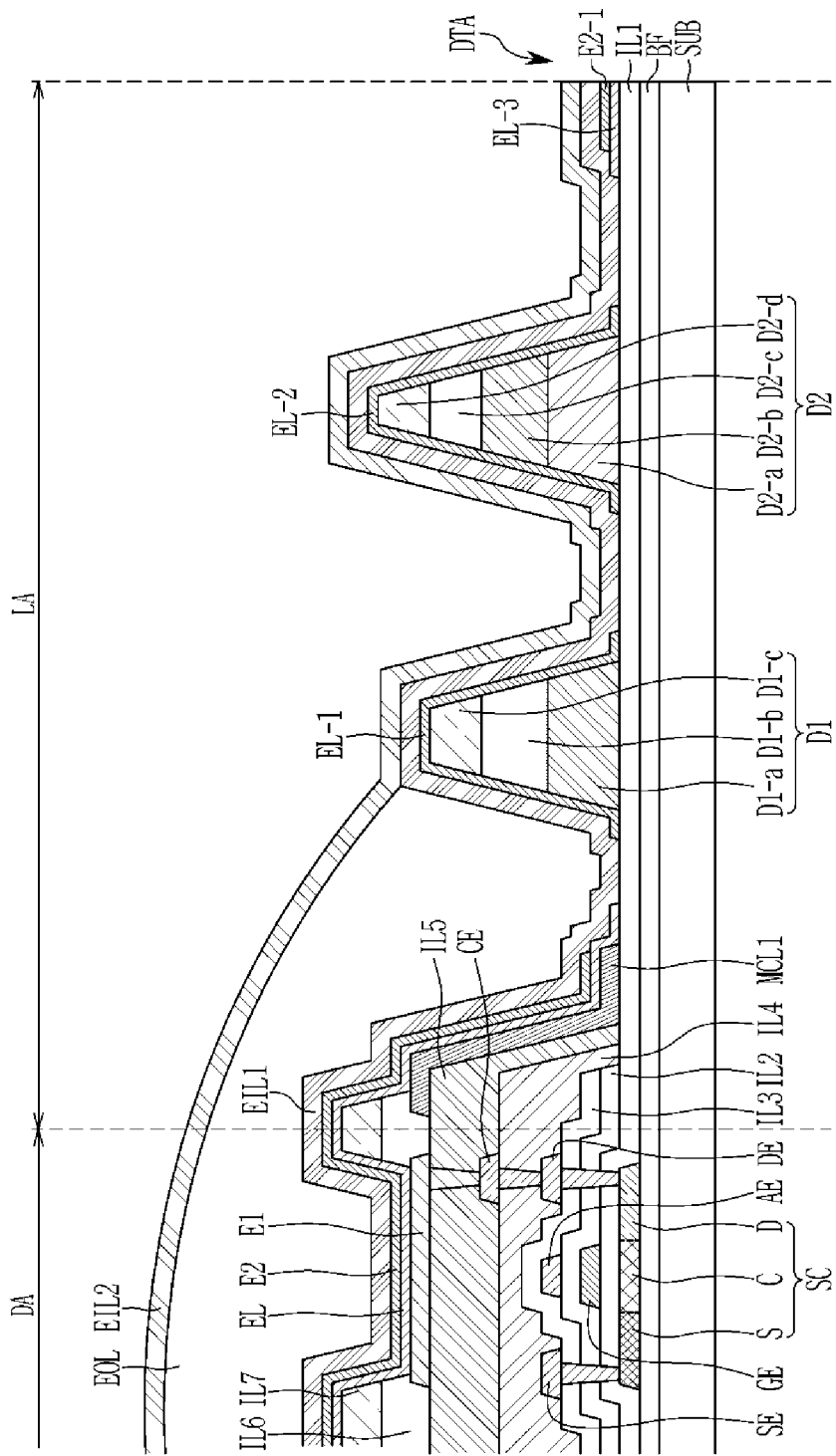

Next, referring to FIG. 12B, the first metal layer MCL1 according to an embodiment may overlap a part of the second organic insulating layer IL5. One end of the first metal layer MCL1 may be disposed between the second organic insulating layer IL5 and the pixel definition layer IL6. Specifically, one end of the first metal layer MCL1 may be positioned on the upper surface of the second organic insulating layer IL5 and may have a shape that is in contact with the first inorganic insulating layer IL1 positioned in the peripheral area LA while extending along the side of the second organic insulating layer IL5.

The first metal layer MCL1 may be formed after forming the second organic insulating layer IL5 and before forming the pixel definition layer IL6. The first metal layer MCL1 may include the same material as the first electrode E1 and may be manufactured in the same process. However, it is not limited thereto, and may be manufactured through a process using a different mask even though it is positioned on the same layer.

Figure 12C:
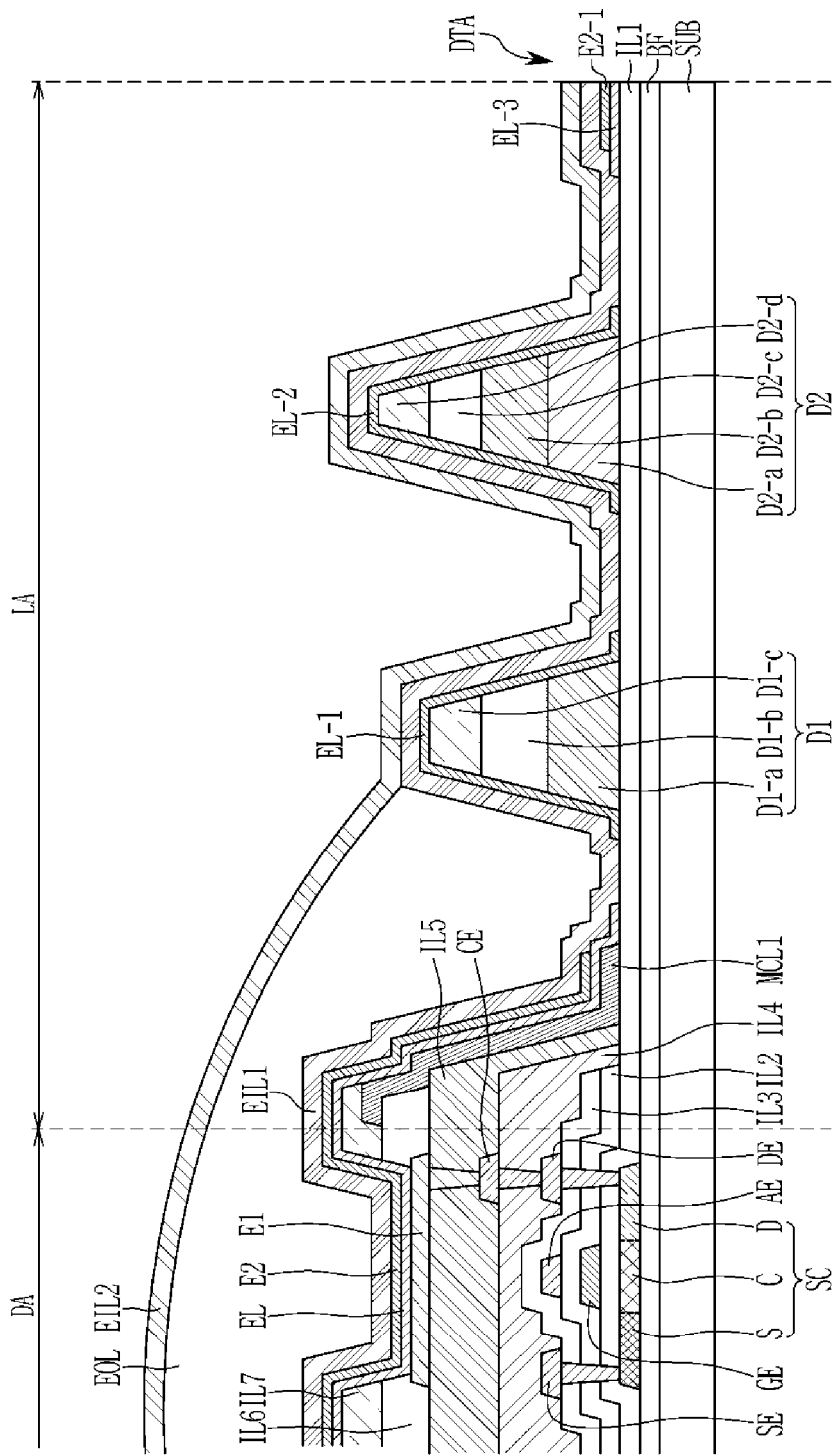

Next, referring to FIG. 12C, the first metal layer MCL1 according to an embodiment may overlap a part of the pixel definition layer IL6. One end of the first metal layer MCL1 may be disposed between the pixel definition layer IL6 and the spacer IL7. Specifically, one end of the first metal layer MCL1 may be positioned on the upper surface of the pixel definition layer IL6 and have a form in contact with the first inorganic insulating layer IL1 positioned in the peripheral area LA while extends along the side of the pixel definition layer IL61 and the second organic insulating layer IL5.

The first metal layer MCL1 may be formed after forming the pixel definition layer IL6 and before forming the spacer IL7. The first metal layer MCL1 may be manufactured using a separate mask.

Figure 12D:
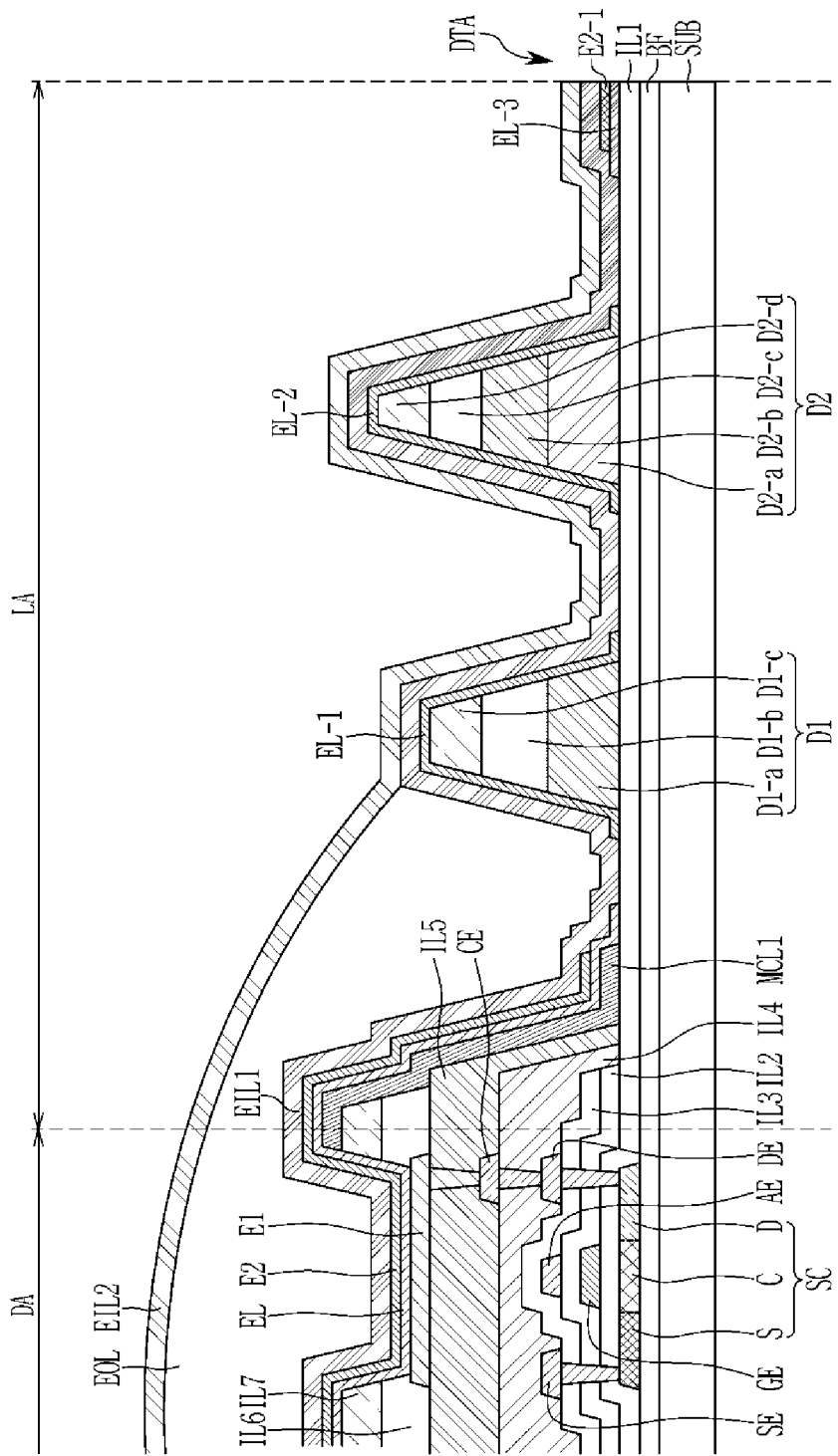

Next, referring to FIG. 12D, the first metal layer MCL1 according to an embodiment may overlap the spacer IL7. One end of the first metal layer MCL1 may be disposed on the upper surface of the spacer IL7 and have a shape in contact with the first inorganic insulating layer IL1 disposed in the peripheral area LA while extending along the side of the spacer IL7, the pixel definition layer IL6, and the second organic insulating layer IL5.

The first metal layer MCL1 may be formed after forming the spacer IL7 and before forming the intermediate layer EL. The first metal layer MCL1 may be manufactured using a separate mask.

Hereinafter, the display device according to an embodiment is described with reference to FIG. 13A to FIG. 13E. FIG. 13A, FIG. 13B, FIG. 13C, FIG. 13D, and FIG. 13E are cross-sectional views of a display panel according to an embodiment, respectively. Description of the same constituent elements as the above-described constituent elements is omitted for ease in explanation of this embodiment.

Figure 13A:
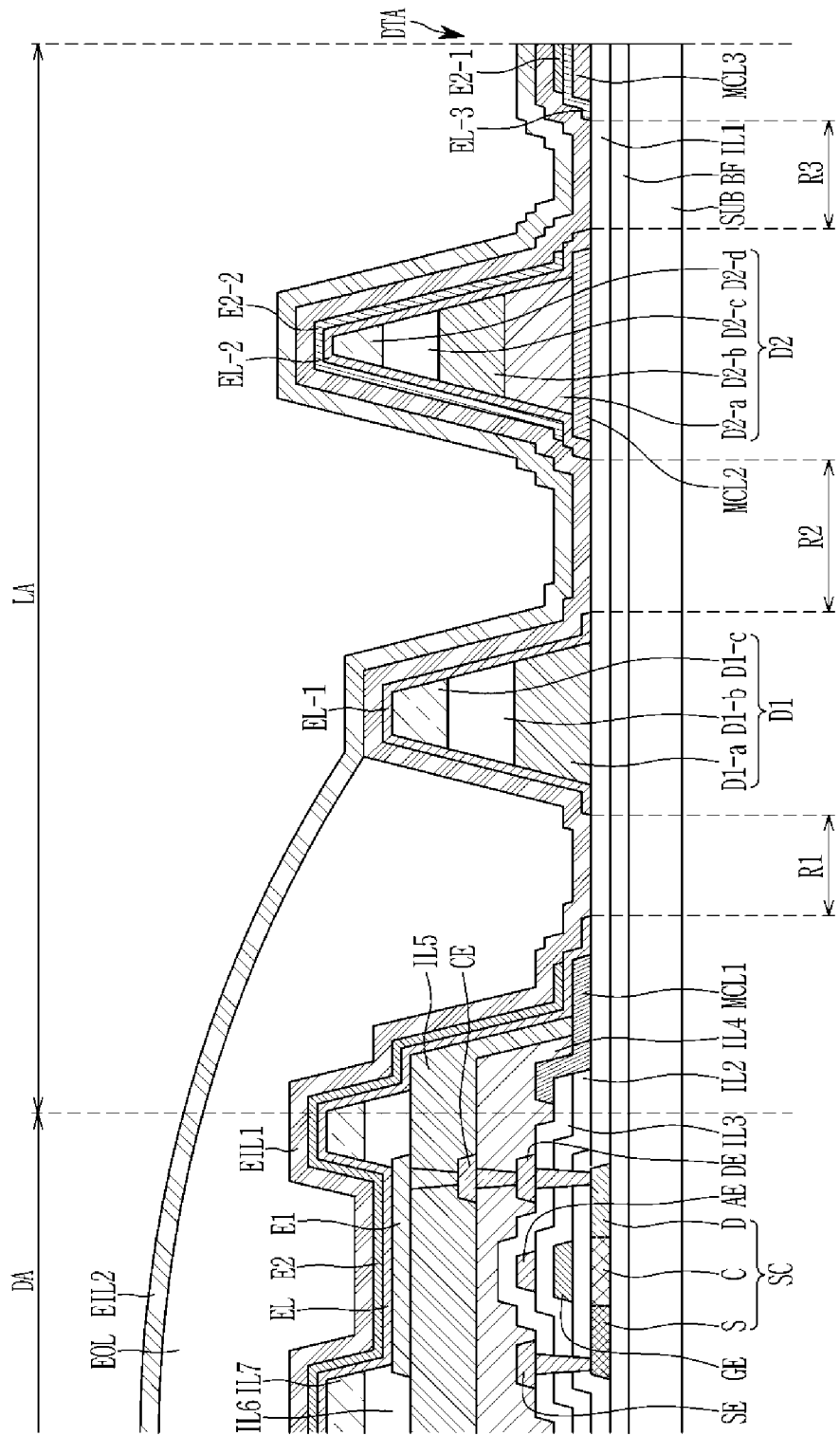
FIG. 13A, FIG. 13B, FIG. 13C, FIG. 13D, and FIG. 13E are cross-sectional views of a display panel according to an embodiment, respectively.

Referring to FIG. 13A, the display device according to an embodiment may further include a second metal layer MCL2 overlapping the second dam D2 and a third metal layer MCL3 overlapping the end of the peripheral area LA. The second metal layer MCL2 and the third metal layer MCL3 may include the same material as the first metal layer MCL1 and may be formed in the same process.

The second metal layer MCL2 may be positioned between the first inorganic insulating layer IL1 and the bottom surface of the second dam D2. Both ends of the second metal layer MCL2 may have a more protruded shape than the bottom surface of the second dam D2.

The first-second layer EL-2 may be positioned above the second dam D2. The first-second layer EL-2 may cover the end of the second metal layer MCL2 while covering the upper and side surfaces of the second dam D2. The first-second layer EL-2 may be in contact with the first inorganic insulating layer IL1 while covering the upper surface and the exposed side of the second metal layer MCL2 exposed by the second dam D2.

A second-second layer E2-2 may be disposed on the first-second layer EL-2. The second-second layer E2-2 may cover the upper and side surfaces of the second dam D2. The end of the second-second layer E2-2 may substantially coincide with the end of the second metal layer MCL2. Here, the fact that the end of the second-second layer E2-2 and the end of the second metal layer MCL2 substantially coincide includes that two ends are completely aligned or that any one end may be finely protruded.

In the process of irradiating the laser during the manufacturing process, the laser may be irradiated from the first opening area R1 to the second opening area R2 and may be irradiated to the third opening area R3. That is, the laser may not be irradiated between the second opening area R2 and the third opening area R3, and at this time, the second-second layer E2-2 may be formed while a part of the second electrode material layer remains in the area where the laser is not irradiated. At this time, as the second metal layer MCL2 is positioned between the substrate SUB and the second-second layer E2-2, the second metal layer MCL2 blocks the heat generated from the laser from being transferred to the second-second layer E2-2. The end of the second-second layer E2-2 may be provided in a flat shape. The first encapsulation inorganic layer EIL1 and the second encapsulation inorganic layer EIL2 positioned on the second-second layer E2-2 may be provided in a stable form.

However, when the laser is irradiated without the second metal layer MCL2, the second-second layer E2-2 of a fairly thin thickness may have a form in which the end is rolled up by the heat generated from the laser. In this case, cracks may occur in the inorganic layers EIL1 and EIL2, and the reliability of the display device may be lowered by penetration of foreign particles.

The third metal layer MCL3 may be disposed under the first-third layer EL-3 and the second-first layer E2-1. The third metal layer MCL3 may be disposed between the first inorganic insulating layer IL1 and the first-third layer EL-3. The end of the first-third layer EL-3 may cover the end of the third metal layer MCL3.

The laser may not be irradiated between the third opening area R3 and the area where the opening area DTA is formed, and in this case, the second-first layer E2-1 may be formed while a part of the second electrode material layer remains in the area where the laser is not irradiated. At this time, as the third metal layer MCL3 is positioned between the substrate SUB and the second-first layer E2-1, the third metal layer MCL3 blocks the heat generated from the laser from being transferred to the second-first layer E2-1 and the end of layer E2-1 may be provided in a flat shape. The first encapsulation inorganic layer EIL1 and the second encapsulation inorganic layer EIL2 positioned on the second-first layer E2-1 may be provided in a stable form.

However, when the laser is irradiated without the third metal layer MCL3, the second-first layer E2-1, which is positioned adjacent to the third opening area R3, has a fairly thin thickness, so the end of the second-first layer E2 may have a rolled up shape by the laser irradiated to the third opening area R3. In this case, cracks may occur in the inorganic layers EIL1 and EIL2 positioned on the second-first layer E2-1, and the reliability of the display device may be lowered by penetration of foreign particles.

On the other hand, FIG. 13A shows the second metal layer MCL2 overlapping the second dam D2 and the third metal layer MCL3 disposed adjacent to the opening area DTA. However, it is not limited to this position, and a metal layer overlapping the first dam D1 may be further included, or one of the second metal layer and the third metal layer may be omitted. Of course, various combinations of the above-described embodiments are possible.

The area where the second electrode material layer remains may have a form in which the end is rolled up by laser irradiation, but the display device according to an embodiment blocks the heat transferred to the second electrode material layer by positioning the metal layer in the corresponding area, thereby it is possible to form the layers E2-1 and 2-2 with the end of a flat shape. According to an embodiment, various combinations of the positions may be possible so that the metal layer is positioned in the area where the second electrode material layer remains.

Figure 13B:
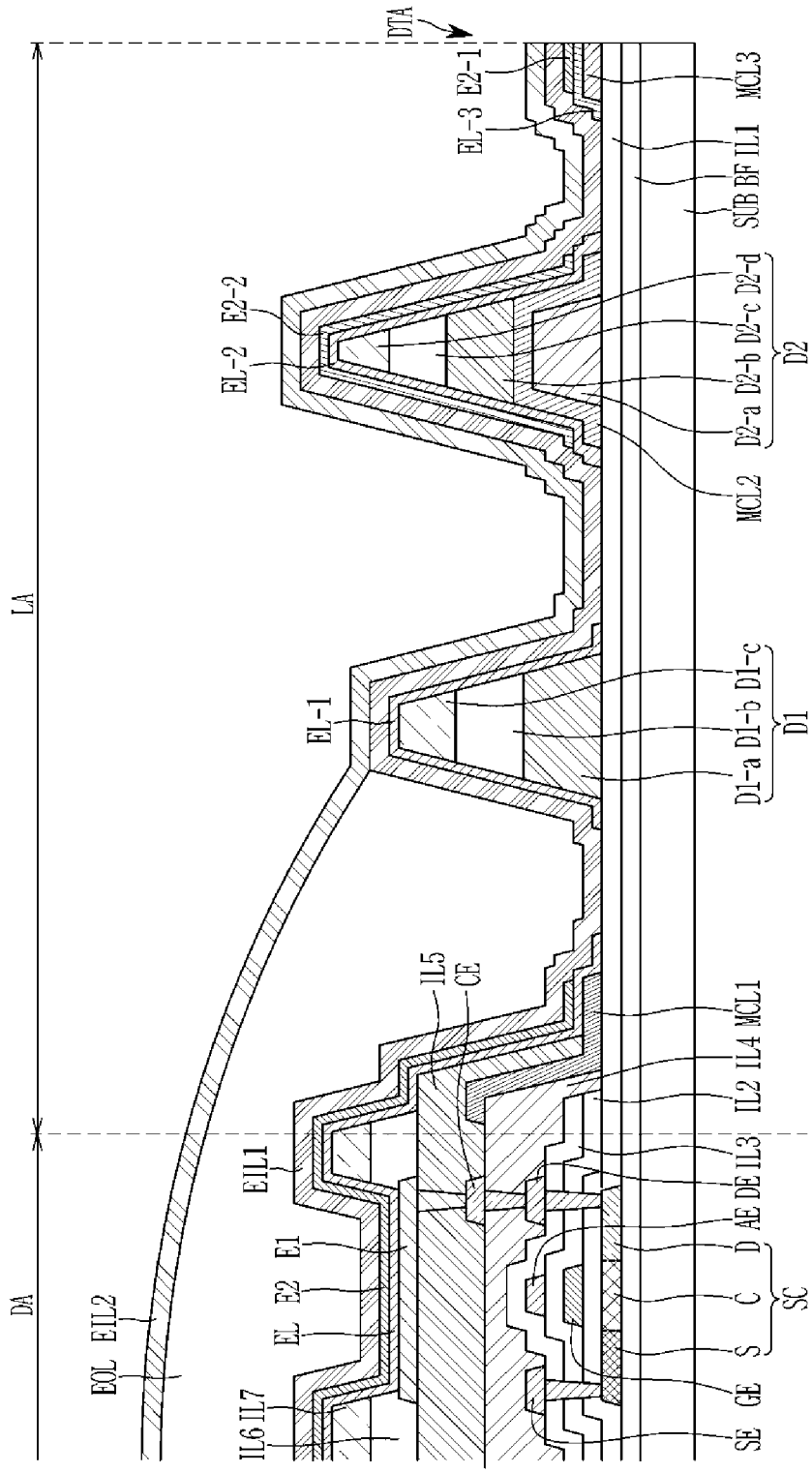

Referring to FIG. 13B, the second metal layer MCL2 according to an embodiment may be disposed between the second-first sub-dam D2-a and the second-second sub-dam D2-b. One end of the first metal layer MCL positioned in the display area DA may be positioned between the first organic insulating layer IL4 and the second organic insulating layer IL5. The third metal layer MCL3 may be positioned between the first inorganic insulating layer IL1 and the first-third layer EL-3.

The first metal layer MCL, the second metal layer MCL2, and the third metal layer MCL3 may be formed after forming the first organic insulating layer IL4 and before forming the second organic insulating layer IL5. The first metal layer MCL, the second metal layer MCL2, and the third metal layer MCL3 may include the same material as the connecting member CE, and may be manufactured in the same process. However, it is not limited thereto, and may be manufactured through a process using a different mask even though it is positioned on the same layer.

Figure 13C:
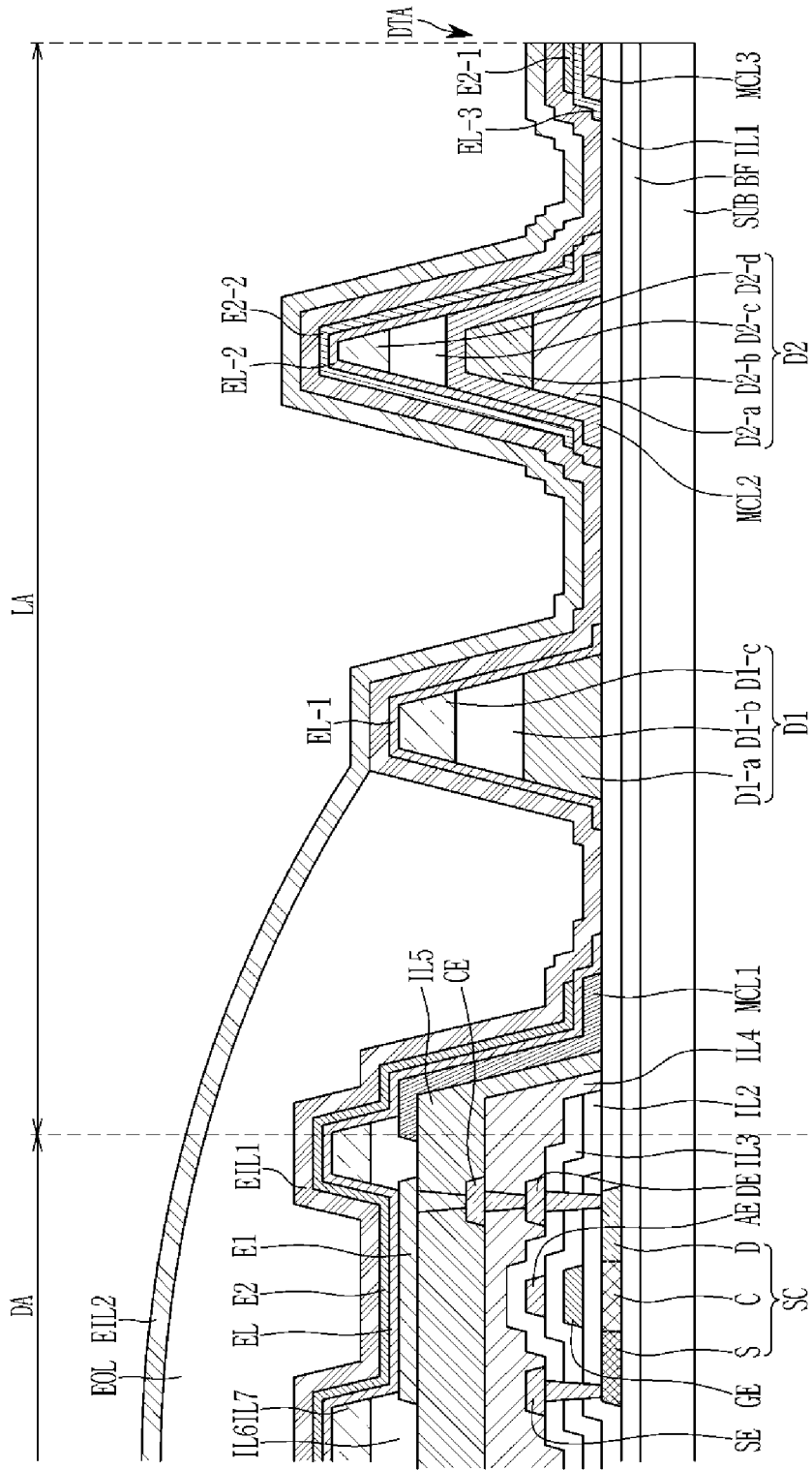

Next, referring to FIG. 13C, the second metal layer MCL2 according to an embodiment may be disposed between the second-second sub-dam D2-b and the second/third sub-dam D2-c. One end of the first metal layer MCL positioned in the display area DA may be positioned between the second organic insulating layer IL5 and the pixel definition layer IL6. The third metal layer MCL3 may be positioned between the first inorganic insulating layer IL1 and the first-third layer EL-3.

The first metal layer MCL, the second metal layer MCL2, and the third metal layer MCL3 may be formed after forming the second organic insulating layer IL5 and before forming the pixel definition layer IL6. The first metal layer MCL, the second metal layer MCL2, and the third metal layer MCL3 may include the same material as the first electrode E1 and may be manufactured in the same process. However, it is not limited thereto, and may be manufactured through a process using a different mask even though it is positioned on the same layer.

Figure 13D:
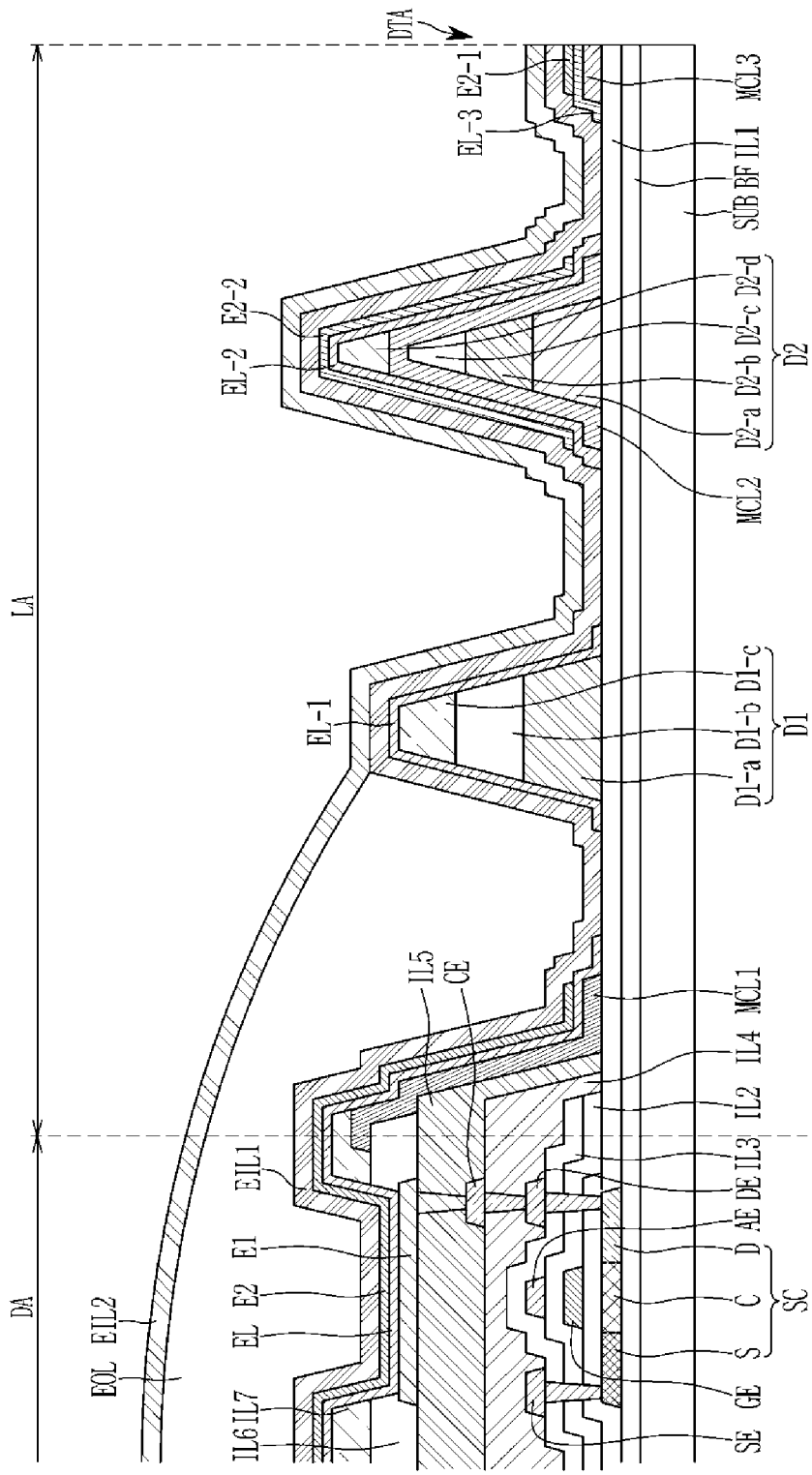

Next, referring to FIG. 13D, the second metal layer MCL2 according to an embodiment may be disposed between the second/third sub-dam D2-c and the second/fourth sub-dam D2-d. One end of the first metal layer MCL positioned in the display area DA may be positioned between the pixel definition layer IL6 and the spacer IL7. The third metal layer MCL3 may be positioned between the first inorganic insulating layer IL1 and the first-third layer EL-3.

The first metal layer MCL, the second metal layer MCL2, and the third metal layer MCL3 may be formed after forming the pixel definition layer IL6 and before forming the spacer IL7. The first metal layer MCL, the second metal layer MCL2, and the third metal layer MCL3 may be manufactured using a separate mask.

Figure 13E:
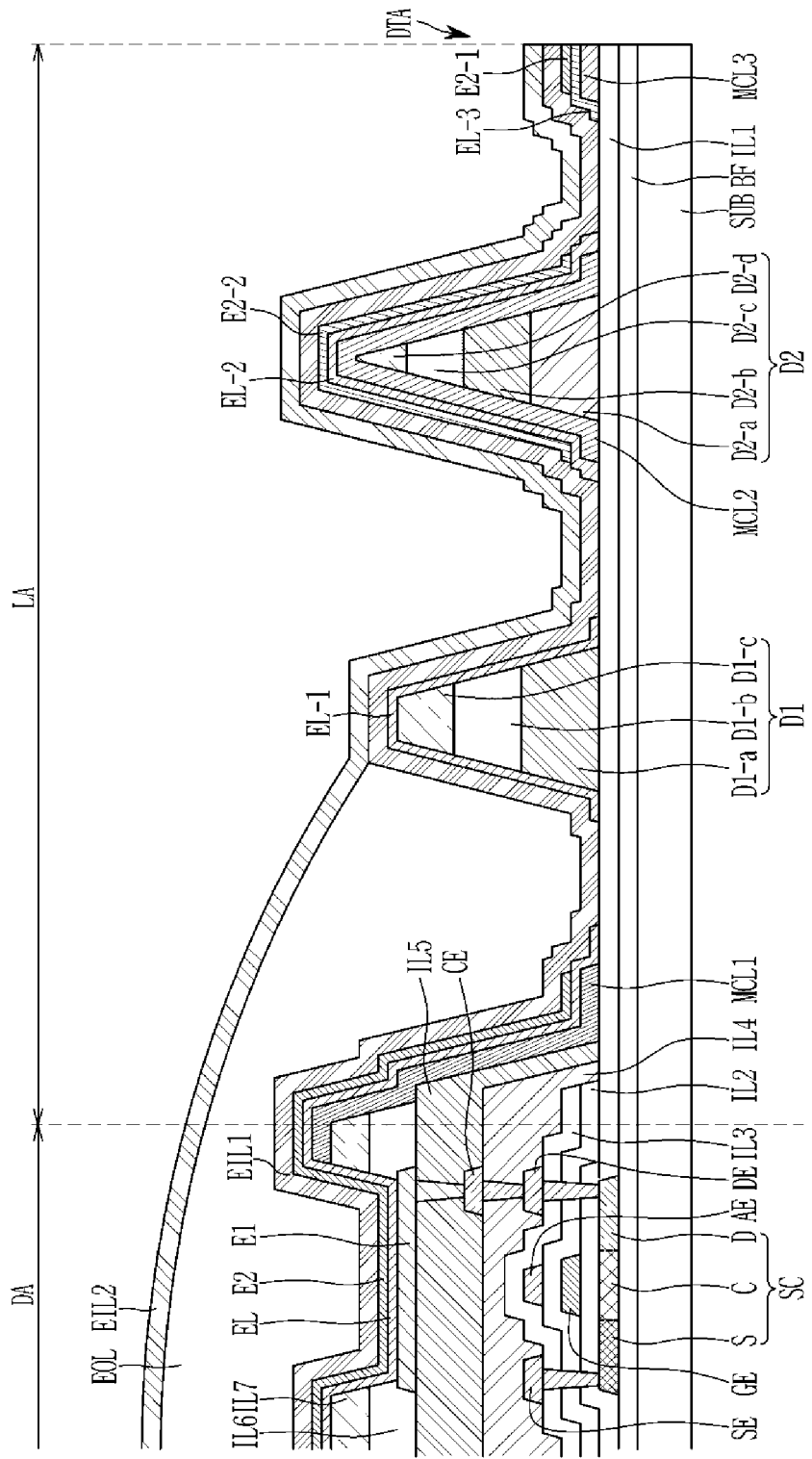

Next, referring to FIG. 13E, the second metal layer MCL2 according to an embodiment may be disposed on the second/fourth sub-dam D2-d. The first metal layer MCL positioned in the display area DA may be positioned on the upper surface of the spacer IL7.

The first metal layer MCL, the second metal layer MCL2, and the third metal layer MCL3 may be formed after forming the spacer IL7 and before forming the intermediate layer EL. The first metal layer MCL, the second metal layer MCL2, and the third metal layer MCL3 may be manufactured using a separate mask.

Figure 14:
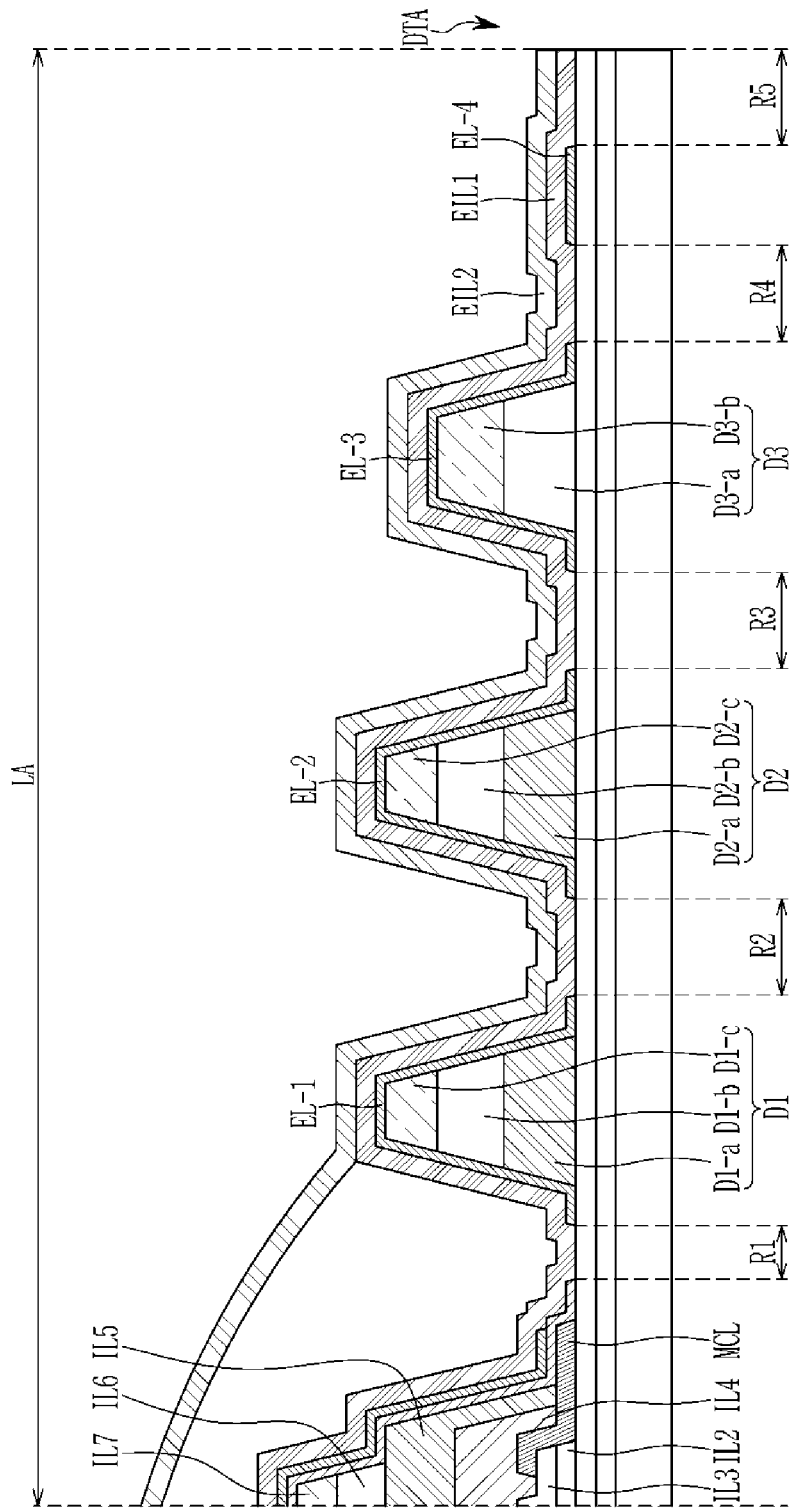
FIG. 14 is a cross-sectional view of a display panel according to an embodiment.

Next, the display panel according to an embodiment is described with reference to FIG. 14. A description of the constituent elements that are the same as or similar to the above-described constituent elements is omitted for ease in explanation of this embodiment.

A first dam D1, a second dam D2, and a third dam D3 may be positioned in the peripheral area LA according to an embodiment.

The first dam D1 may include a first-first sub-dam D1-a, a first-second sub-dam D1-b, and a first-third sub-dam D1-c. The first-first sub-dam D1-a may be positioned on the same layer as the second organic insulating layer IL5 positioned in the display area DA and may include the same material. The first-first sub-dam D1-a may be formed in the same process as the second organic insulating layer IL5 positioned in the display area DA. The first-second sub-dam D1-b may be positioned on the same layer as the pixel definition layer IL6 positioned in the display area DA and may include the same material. The first-second sub-dam D1-b may be formed in the same process as the pixel definition layer IL6 positioned in the display area DA. The first-third sub-dam D1-c may be positioned on the same layer as the spacer IL7 positioned in the display area DA and may include the same material. The first-third sub-dam D1-c may be formed in the same process as the spacer IL7 positioned in the display area DA.

The second dam D2 may include a second-first sub-dam D2-a, a second-second sub-dam D2-b, and a second/third sub-dam D1-c. The second dam D2 may be formed as the triple layer like the first dam D1.

The third dam D3 may include a third/first sub-dam D3-a and a third/second sub-dam D3-b. The third/first sub-dam D3-a may be positioned on the same layer as the pixel definition layer IL6 positioned in the display area DA and may include the same material. The third/first sub-dam D3-a may be formed in the same process as the pixel definition layer IL6 positioned in the display area DA. The third/second sub-dam D3-b may be positioned on the same layer as the spacer IL7 positioned in the display area DA and may include the same material. The third/second sub-dam D3-b may be formed in the same process as the spacer IL7 positioned in the display area DA.

This specification shows the first dam D1, the second dam D2, and the third dam D3 positioned in the peripheral area, but the shape and number of dams may be variously modified according to embodiments. For example, the second dam D2 may be omitted and the first dam D1 and the third dam D3 may be included, or two or more third dams D3 may be included.

In the peripheral area LA, the first-first layer EL-1, the first-second layer EL-2, the first-third layer EL-3, and the first/fourth layer EL-4 may be positioned. In the peripheral area LA, a first opening area R1 between the intermediate layer EL and the first-first layer EL-1, a second opening area R2 between the first-first layer EL-1 and the first-second layer EL-2, a third opening area R3 between the first-second layer EL-2 and the first-third layer EL-3, a fourth opening area R4 between the first-third layer EL-3 and the first/fourth layer EL-4, and a fifth opening area R5 between the first/fourth layer EL-4 and the opening area DTA may be included. Since the intermediate material layer has a broken shape in the first to fifth opening areas R1, R2, R3, R4, and R5, the path through which foreign particles may inflow may be blocked.

The opening area DTA may have the inner surface made of the end of the substrate SUB, the end of the buffer layer BL, the end of the first inorganic insulating layer IL1, the end of the first encapsulation inorganic layer EIL1, and the end of the second encapsulation inorganic layer EIL2. It goes without saying that a combination of various embodiments described in this specification is possible.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a substrate including an opening area, a peripheral area surrounding the opening area, and a display area surrounding the peripheral area;
    a transistor overlapping the display area and disposed on the substrate;
    a first electrode electrically connected to the transistor;
    an intermediate layer and a second electrode disposed on the first electrode and extending to the peripheral area; and
    a first metal layer overlapping the intermediate layer and the second electrode in the peripheral area,
    wherein an end of the first metal layer and an end of the second electrode extended from the display area and connected to the second electrode overlapping the display area are aligned, and
    an end of the intermediate layer is protruded more than the end of the first metal layer such that a bottom surface of the end of the intermediate layer that protrudes more than the end of the first metal layer is disposed at a same distance above the substrate as a bottom surface of the first metal layer.

2. The display device of claim 1, wherein
    the display device further includes at least two or more dams disposed in the peripheral area,
    the at least two or more dams include a first dam and a second dam separated from each other, and
    the display device includes:
        a first-first layer overlapping the first dam; and
        a first-second layer overlapping the second dam.

3. The display device of claim 2, further comprising:
    a second opening positioned between the first dam and the second dam.

4. The display device of claim 2,
wherein the at least two or more dams comprises a third dam,
wherein a third opening is positioned between the first dam and the third dam,
wherein a portion of the first metal layer is disposed underneath the third dam.

5. The display device of claim 2, wherein
the display device further includes a first-third layer disposed between the second dam and the opening area.

6. The display device of claim 5, wherein
the display device further includes a second-first layer disposed between the second dam and the opening area.

7. The display device of claim 5, wherein
the display device further includes a second metal layer overlapping the second dam with respect to a cross-sectional view of the substrate such that the second metal layer extends from a first end to a second end of the second dam and does not extend outside of the dam,
the second metal layer overlaps at least one of the first-first layer and the first-second layer, and
the display device further includes a second-second layer overlapping the second metal layer and disposed on a same layer as the second electrode.

8. The display device of claim 2, wherein
the intermediate layer includes a functional layer, and
the functional layer includes at least one among a hole injection layer, a hole transporting layer, an electron transporting layer, and an electron injection layer, and
the first-first layer includes a same material as at least one among the hole injection layer, the hole transporting layer, the electron transporting layer, and the electron injection layer.

9. The display device of claim 1, wherein
the display device further includes an encapsulation layer disposed on the second electrode, and
the encapsulation layer includes:
a first encapsulation inorganic layer disposed on the second electrode;
an encapsulation organic layer disposed on the first encapsulation inorganic layer; and
a second encapsulation inorganic layer disposed on the encapsulation organic layer.

10. The display device of claim 1, wherein
the display device includes:
an inorganic insulating layer disposed on the substrate;
an organic insulating layer disposed on the inorganic insulating layer; and
a pixel definition layer and a spacer disposed on the organic insulating layer.

11. The display device of claim 10, wherein
the display device includes a plurality of organic insulating layers, and
the first metal layer is positioned between two adjacent organic insulating layers among a plurality of organic insulating layers.

12. The display device of claim 11, wherein
the first metal layer is disposed between the inorganic insulating layer and the organic insulating layer.

13. The display device of claim 10, wherein
the first metal layer is disposed between the organic insulating layer and the pixel definition layer.

14. The display device of claim 10, wherein
the first metal layer is disposed between the pixel definition layer and the spacer.

15. A display device comprising:
a substrate including an opening area, a peripheral area enclosing the opening area, and a display area enclosing the peripheral area;
a transistor overlapping the display area and disposed on the substrate;
a first electrode electrically connected to the transistor;
an intermediate layer and a second electrode disposed on the first electrode and extending into the peripheral area;
a first metal layer overlapping the intermediate layer and the second electrode in the peripheral area; and
an encapsulation layer disposed on the second electrode and including an encapsulation organic layer,
wherein an end of the first metal layer and an end of the second electrode extended from the display area and connected to the second electrode overlapping the display area are aligned, an end of the intermediate layer covers the end of the first metal layer such that a bottom surface of the end of the intermediate layer that protrudes more than the end of the first metal layer is disposed at a same distance above the substrate as a bottom surface of the first metal layer, and
the end of the first metal layer overlaps the encapsulation organic layer.

16. The display device of claim 15, wherein
the end of the second electrode has a flat shape.

17. The display device of claim 15, wherein
the first metal layer includes silver (Ag) or aluminum (Al).

18. The display device of claim 15, wherein:
the display device includes a dam disposed in the peripheral area; and
the display device includes:
a first-first layer overlapping the dam, and
a distance between an end of the first metal layer and an end of the first-first layer adjacent to the first metal layer is about 35 micrometers or more.

19. The display device of claim 18, wherein
an end of the intermediate layer extends to the peripheral area and is separated from the end of the first-first layer.

20. The display device of claim 18, wherein
the intermediate layer includes a functional layer, and
the functional layer includes at least one of: a hole injection layer, a hole transporting layer, an electron transporting layer, and an electron injection layer,
the first-first layer includes a same material as the at least one of: the hole injection layer, the hole transporting layer, the electron transporting layer, and the electron injection layer.

* * * * *